US008519452B2

(12) United States Patent  (10) Patent No.: US 8,519,452 B2
Malhan  (45) Date of Patent:  Aug. 27, 2013

(54) SEMICONDUCTOR DEVICE WITH JUNCTION FIELD-EFFECT TRANSISTOR AND MANUFACTURING METHOD OF THE SAME

(75) Inventor: Rajesh Kumar Malhan, Nagoya (JP)

(73) Assignee: DENSO CORPORATION, Kariya (JP)

( * ) Notice: Subject to any disclaimer, the term of this patent is extended or adjusted under 35 U.S.C. 154(b) by 49 days.

(21) Appl. No.: 13/248,173

(22) Filed: Sep. 29, 2011

(65) Prior Publication Data

US 2012/0080728 A1  Apr. 5, 2012

(30) Foreign Application Priority Data

Sep. 30, 2010 (JP) ................................. 2010-221449

(51) Int. Cl.
*H01L 29/812* (2006.01)
*H01L 21/337* (2006.01)
*H01L 29/768* (2006.01)

(52) U.S. Cl.
USPC ............ 257/280; 257/E29.317; 257/E21.445; 257/E21.065; 257/E21.066; 257/E27.069; 438/173; 438/186

(58) Field of Classification Search
USPC ........... 257/280, E21.065, E21.066, E21.605, 257/E27.069; 438/186, 173
See application file for complete search history.

(56) References Cited

U.S. PATENT DOCUMENTS

| 7,241,694 B2* | 7/2007 | Takeuchi et al. | 438/700 |
| 7,355,207 B2* | 4/2008 | Kumar et al. | 257/77 |
| 8,274,086 B2* | 9/2012 | Malhan et al. | 257/76 |
| 2004/0135178 A1* | 7/2004 | Onose et al. | 257/262 |
| 2004/0232450 A1* | 11/2004 | Yilmaz | 257/213 |
| 2005/0258454 A1* | 11/2005 | Kumar et al. | 257/211 |
| 2008/0277695 A1* | 11/2008 | Li et al. | 257/262 |
| 2009/0272983 A1* | 11/2009 | Kumar et al. | 257/77 |
| 2011/0127586 A1* | 6/2011 | Bobde et al. | 257/262 |
| 2011/0297964 A1* | 12/2011 | Miura | 257/77 |

FOREIGN PATENT DOCUMENTS

| JP | U-63-124762 | | 8/1988 |
| JP | 2002270841 A | * | 9/2002 |
| JP | A-2002-270841 | | 9/2002 |
| JP | 2010034279 A | * | 2/2010 |
| JP | A-2010-034279 | | 2/2010 |

OTHER PUBLICATIONS

Office Action dated Dec. 25, 2012 issued in corresponding JP application No. 2010-221449 (and English translation).

* cited by examiner

*Primary Examiner* — Marcos D. Pizarro
*Assistant Examiner* — Hoan Nguyen
(74) *Attorney, Agent, or Firm* — Posz Law Group, PLC

(57) ABSTRACT

A semiconductor device with a JFET is disclosed. The semiconductor device includes a trench and a contact embedded layer formed in the trench. A gate wire is connected to the contact embedded layer, so that the gate wire is connected to an embedded gate layer via the contact embedded layer. In this configuration, it is possible to downsize a contact structure between the embedded gate layer and the gate wire.

7 Claims, 27 Drawing Sheets

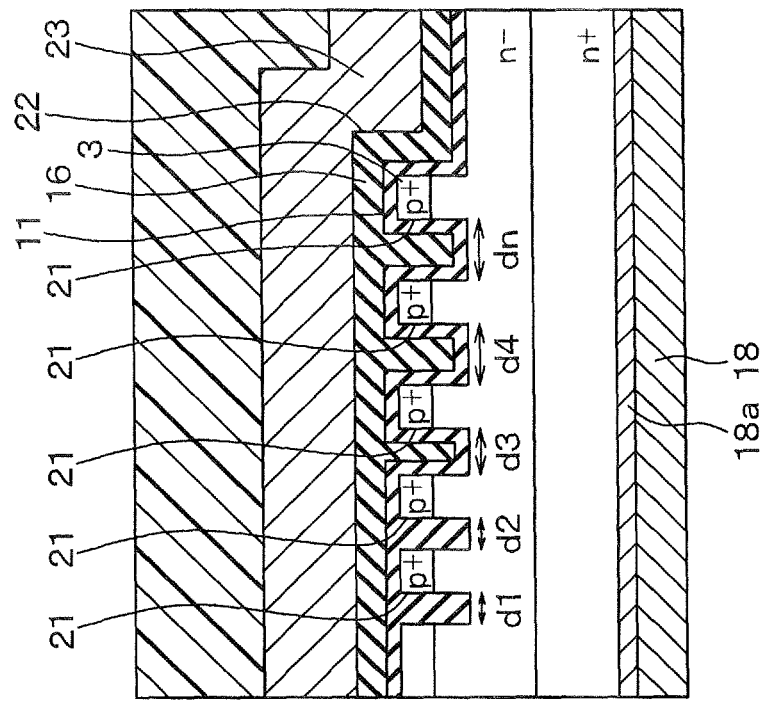
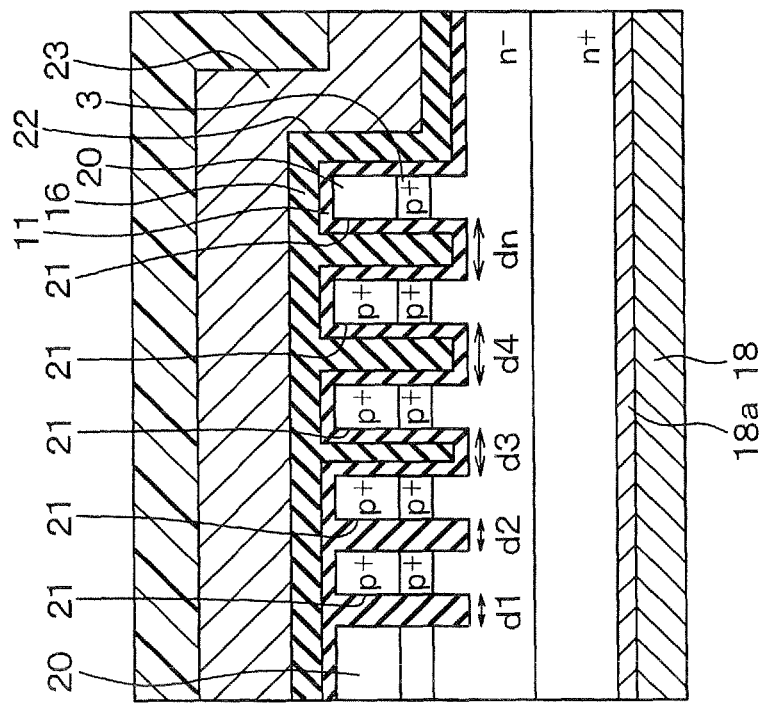
FIG. 23A
FIG. 23B

US 8,519,452 B2

SEMICONDUCTOR DEVICE WITH JUNCTION FIELD-EFFECT TRANSISTOR AND MANUFACTURING METHOD OF THE SAME

CROSS REFERENCE TO RELATED APPLICATION

The present application is based on and claims priority to Japanese Patent Application No. 2010-221449 filed on Sep. 30, 2010, disclosure of which is incorporated herein by reference.

TECHNICAL FIELD

The present disclosure relates to a semiconductor device including a junction field-effect transistor (referred to hereinafter as JFET) made of a SiC substrate or the like, and to also a manufacturing method of the same.

BACKGROUND

Conventionally, there is a semiconductor device including a cell portion having a JFET and an outer peripheral breakdown proof portion surrounding the cell portion (see JP-2005-340249A1 and JP-2005-340250A1, which correspond to US2005/0258454A1). FIG. 27 is a diagram illustrating a sectional structure of a JFET of this kind of a SiC semiconductor device as related art.

As shown in FIG. 27, the JFET is formed using a semiconductor substrate J6, in which a drift layer J2 made of $n^-$-type SiC, a $p^-$-type SiC layer J3, a buffer layer J4 made of $n^-$-type or $p^-$-type SiC, and an $n^+$-type source layer J5 are formed, in turn, on a $n^+$-type SiC base J1. A trench J7 is formed in the semiconductor substrate J6. The semiconductor substrate J6 includes a channel layer J8 made of $n^-$-type SiC and a top gate layer J9 made of $p^+$-type SiC, which are embedded in the trench J7.

In this configuration, a part of the $p^+$-type SiC layer J3 adjoining the channel layer J8 acts as an embedded gate layer J10. An extension amount of a depletion layer in the channel layer J8 sandwiched between the top gate layer J9 and the embedded gate layer J10 can be controlled by voltage application to the top gate layer J9 and the embedded gate layer J10. Specifically, the top gate layer J9 is electrically connected to a gate wire J12 via a contact hole J11a formed in an interlayer insulation film J11. The embedded gate layer J10 is electrically connected to the gate wire J12 via a trench J13 and a contact hole J11b. The trench J13 penetrates through the $n^+$-type source layer J5 and the buffer layer J4 into the $p^+$-type SiC layer J3. The contact hole J11b is formed in the interlayer insulation film J11.

A source electrode J14 is connected to the $n^+$-type source layer J5 via a contact hole J11c formed in the inter-layer insulation film J11 and a drain electrode J15 is connected to a rear surface of the $n^+$-type SiC base J1, so that a current flows between a drain and a source when the channel region is formed in the channel layer J8.

According to the above-configured JFET, however, an electrical connection between the embedded gate layer J10 and the gate wire J12 is made via the trench J13, which penetrates through the $n^+$-type source layer J5 and the buffer layer J4 into the $p^+$-type SiC layer J3. In this kind of structure, since the interlayer insulation film J11 and the gate wire J12 are arranged in the trench 13, width of the trench J13 becomes large, and sufficient downsizing cannot be achieved. For this reason, it is desirable to provide a structure that can downsize a contact structure between the embedded gate layer J10 and the gate wire J12.

It should be noted that although the above explanation is directed to the semiconductor device using SiC as its semiconductor material, the same is applicable to a semiconductor device using other semiconductor materials.

SUMMARY

In view of the foregoing, it an objective of the present disclosure to provide a semiconductor device with a JFET that can downsize a contact structure between an embedded gate layer and a gate wire.

According to a first aspect of the present disclosure, a semiconductor device with a JFET includes a junction field-effect transistor. The junction field-effect transistor includes a base, a drift layer, a semiconductor layer, a source layer, a first trench, a channel layer, a top gate layer, a first gate wire, a second gate wire, and a drain electrode. The base has a principal surface, is made of a semiconductor material, and has a first conductivity type. The drift layer is arranged above the base, is configured as an epitaxial layer, and has the first conductivity type. The semiconductor layer is arranged above the drift layer and has a second conductivity type. The source layer is arranged above the semiconductor layer, has the first conductivity type, and has an impurity concentration larger than the drift layer. The first trench penetrates through the source layer and the semiconductor layer into the drift layer. The channel layer is arranged in the first trench, and has the first conductivity type. The top gate layer is arranged on a surface of the channel layer in the first trench, and has the second conductivity type. The first gate wire is electrically connected to the top gate layer. The second gate wire is electrically connected to an embedded gate layer, which is a part of the semiconductor layer adjoining the channel layer. The source electrode is electrically connected to the source layer. The drain electrode is electrically connected to a rear surface of the substrate. The semiconductor device further includes a second trench and a contact embedded layer. The second trench penetrates through the source layer into the embedded gate layer. The contact embedded layer completely fills the second trench, and has the second conductivity type. The second gate wire is connected to the contact embedded layer, so that the second gate wire is connected to the embedded gate layer via the contact embedded layer.

According to the above semiconductor device, an electrical connection between the embedded gate layer and the second gate wire is made by the contact embedded layer arranged in the second trench. Therefore, width of the second trench, in which only the contact embedded layer is arranged, can be narrowed down, as compared with width of a trench of a conventional semiconductor device where an interlayer insulation film and a gate wire etc. are arranged in the trench. Therefore, the semiconductor device with the JFET can downsize a contact structure between the embedded gate layer and the second gate wire.

According to a second aspect of the present disclosure, a manufacturing method of a semiconductor device with a junction field-effect transistor includes preparing a semiconductor substrate. The semiconductor substrate includes: a base that has a principal surface, is made of a semiconductor material, and has a first conductivity type; a drift layer that is formed above the base by epitaxial growth, and has the first conductivity type; a semiconductor layer that is formed above the drift layer and has a second conductivity type; and a source layer that is formed above the semiconductor layer, has an impurity concentration larger than the drift layer, and has the first conductivity type. The manufacturing method further includes: forming a first trench that penetrates through the source layer and the semiconductor layer into the drift layer; forming a channel layer having the first conductivity type on a surface of the semiconductor substrate including an inside of the first trench; forming a second trench spaced apart from the first trench, so that the second trench penetrates through the channel layer and the source layer into the semiconductor layer; forming a second conductivity type layer in the first trench and in the second trench, so that in the first trench, the second conductivity type layer is formed on a surface of the channel layer; and removing the second conductivity type layer and the channel layer above the source layer by planarization of a surface of the semiconductor substrate after forming the second conductivity type layer, so that a top gate layer is formed in the first trench and a contact embedded layer is formed in the second trench. In the above, the top gate layer is formed from the channel layer and the second conductivity type layer in the first trench, and the contact embedded layer is formed from the second conductivity type layer in the second trench. The manufacturing method further includes: forming an interlayer insulation film on a surface of the semiconductor substrate and forming contact holes for exposing the source layer, the top gate layer and the contact embedded layer in the interlayer insulation film, respectively; forming a source electrode electrically connected to the source layer through a first one of the contact holes, a first gate wire electrically connected to the top gate layer through a second one of the contact holes, and a second gate wire electrically connected to the contact embedded layer through a third one of the contact holes; and forming a drain electrode electrically connected to the base on a rear surface of the semiconductor substrate.

According to the above manufacturing method, it is possible to manufacture a semiconductor device with a JFET that can downsize a contact structure between an embedded gate layer and a gate wire.

BRIEF DESCRIPTION OF THE DRAWINGS

The above and other objects, features and advantages of the present disclosure will become more apparent from the following detailed description made with reference to the accompanying drawings. In the drawings:

FIG. 23A is a sectional views illustrating a p-type region of a guard ring structure in an outer peripheral breakdown proof portion of the first embodiment; and FIG. 23B is a sectional view illustrating a guard ring structure which a p-type region is configured by only a $p^+$-type SiC layer;

DETAILED DESCRIPTION

Embodiments will be described based on the accompanying drawings. In the followings, like references are used to refer to like parts.

First Embodiment

Figure 1:
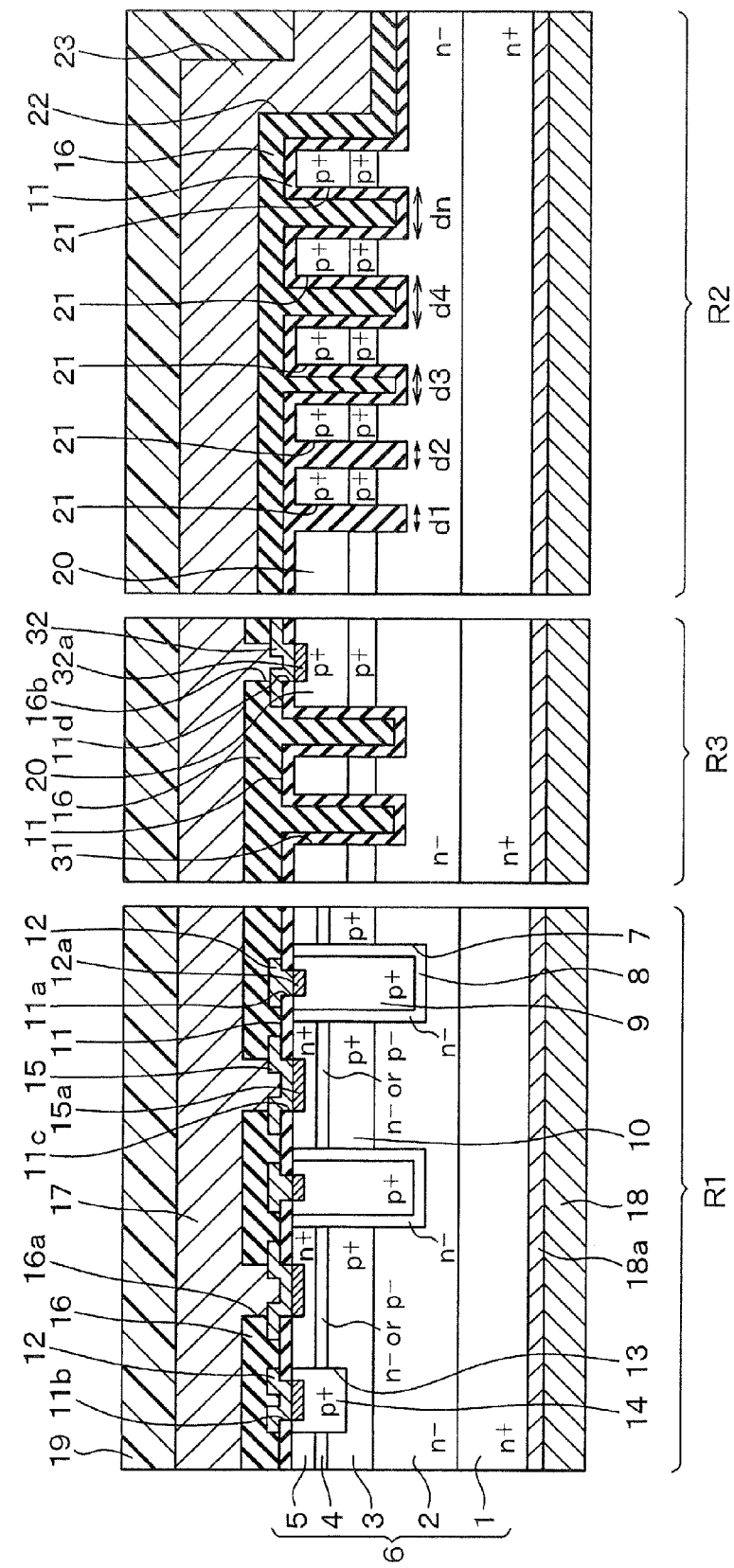
FIG. 1 is a sectional view illustrating an SiC semiconductor device with a JFET of a first embodiment.

A first embodiment will be described. FIG. 1 is a sectional view of an SiC semiconductor device with a JFET of the present embodiment. In the following, with reference to this drawing, a structure of the SiC semiconductor device with the JFET will be described.

The SiC semiconductor device illustrated in FIG. 1 is formed using an $n^+$-type SiC base 1, which uses a (0001) Si-face as its principal surface. For example, the $n^+$-type SiC base 1 used in the present embodiment has a specific electric resistance of $1 \times 10^{19}$ Ω·cm to $1 \times 10^{20}$ Ω·cm, and a thickness of 250 μm to 400 μm (for example, 350 μm). An $n^-$-type drift layer 2 is formed as a film on the principal surface of this $n^+$-type SiC base 1. This $n^-$-type drift layer 2 has, for example, an n-type impurity concentration of $1 \times 10^{15}$ $cm^{-3}$ to $1 \times 10^{16}$ $cm^{-3}$ (for example, $5.0 \times 10^{15}$ $cm^{-3}$), and a thickness of 5.0 μm to 15.0 μm (for example, 13.0 μm).

A $p^+$-type SiC layer 3, a buffer layer 4 made of an $n^-$-type or $p^-$-type SiC, and an $n^+$-type source layer 5 are formed in order on a surface of the $n^-$-type drift layer 2. The $p^+$-type SiC layer 3 has, for example, a p-type impurity concentration of $1 \times 10^{18}$ $cm^{-3}$ to $1 \times 10^{20}$ $cm^{-3}$ (for example, $5.0 \times 10^{18}$ $cm^{-3}$), and a thickness of 1.0 μm to 2.0 μm (for example, 1.4 μm). The buffer layer 4 has, for example, an n-type or p-type impurity concentration of $1 \times 10^{14}$ $cm^{-3}$ to $1 \times 10^{16}$ $cm^{-3}$ (for example, $1.0 \times 10^{15}$ $cm^{-3}$), and a thickness of 0.1 μm to 0.5 μm (for example, 0.3 μm). The $n^+$-type source layer 5 has a larger impurity concentration than the $n^-$-type drift layer 2. For example, the $n^+$-type source layer 5 has the n-type impurity concentration of $5 \times 10^{18}$ $cm^{-3}$ to $1 \times 10^{20}$ $cm^{-3}$ (for example, $2.0 \times 10^{19}$ $cm^{-3}$), and a thickness of 0.5 μm to 1.5 μm (for example, 1.0 μm). As seen the above, the SiC semiconductor device of the present embodiment is formed using the semiconductor substrate 6, in which the layers 2 to 5 are formed in order on the $n^+$-type SiC base 1.

Specifically, the SiC semiconductor device of the present embodiment includes a JFET formation portion (cell portion) R1, an outer peripheral breakdown proof portion R2 and a JFET separation portion (element separation portion) R3. In JFET formation portion R1, JFETs of multiple cells are formed. The outer peripheral breakdown proof portion R2 is formed so as to surround an outer periphery of the JFET formation portion R1. The JFET separation portion (element separation portion) R3 is arranged at a boundary location between the JFET formation portion R1 and the outer peripheral breakdown proof portion R2.

The JFET formation portion R1 is configured as follows. A trench 7 is formed in the JFET formation portion R1 of the semiconductor substrate 6. A channel layer 8 made of $n^-$-type SiC and a top gate layer 9 made of $p^+$-type SiC are embedded in the trench 7. The trench 7 has such a depth that the trench 7 penetrates through the $p^+$-type SiC layer 3, the buffer layer 4 and the $n^+$-type source layer 5 into the $n^-$-type drift layer 2. The trench 7 is formed to have its longitudinal direction, for example, in the direction perpendicular to the drawing sheet. The channel layer 8 has, for example, an n-type impurity concentration of $1 \times 10^{16}$ $cm^{-3}$ to $5 \times 10^{17}$ $cm^{-3}$ (for example, $1.0 \times 10^{17}$ $cm^{-3}$), and a thickness of 0.1 μm to 1.0 μm (for example, 0.3 μm). The top gate layer 9 has, for example, a p-type impurity concentration of $1 \times 10^{18}$ $cm^{-3}$ to $1 \times 10^{20}$ $cm^{-3}$ (for example, $1.0 \times 10^{19}$ $cm^{-3}$), and a thickness of 2.0 μm to 5.0 μm (for example, 3.0 μm). Surfaces of the channel layers 8, the top gate layer 9 and the $n^+$-type source layer 5 are on the same plane.

Because of the above configuration, a part of the $p^+$-type SiC layer 3 adjoining the channel layer 8 is used as an embedded gate layer 10. An extension amount of a depletion layer into the channel layer 8 sandwiched between the top gate layer 9 and the embedded gate layer 10 can be controlled by voltage application the top gate layer 9 and the embedded gate layer 10.

An interlayer insulation film 11, which may include a LTO film etc., is formed on surfaces of the channel layer 8, the top gate layer 9 and the $n^+$-type source layer 5. A gate wire 12 is formed above this interlayer insulation film 11. The gate wire 12 is electrically connected to the top gate layer 9 via a contact hole 11a formed in the interlayer insulation film 11. This structure makes it possible to control the voltage application to the top gate layer 9 via the gate wire 12.

A trench 13 is formed in the semiconductor substrate 6. A $p^+$-type contact embedded layer 14 is formed so as to completely fill the trench 13. The trench 13 penetrates through the $n^+$-type source layer 5 and the buffer layer 4 into the embedded gate layer 10. The $p^+$-type contact embedded layer 14 embedded in the trench 13 is in contact with the embedded gate layer 10. The $p^+$-type contact embedded layer 14 has, for example, a p-type impurity concentration of $1 \times 10^{18}$ $cm^{-3}$ to $1 \times 10^{20}$ $cm^{-3}$ (for example, $1.0 \times 10^{19}$ $cm^{-3}$), and a thickness of 1.0 μm to 3.0 μm (for example, 1.5 μm). The gate wire 12 is electrically connected to the $p^+$-type contact embedded layer 14 via a contact hole 11b formed in the interlayer insulation film 11. This structure makes it possible to control the voltage application to the embedded gate layer 10, which is connected to the $p^+$-type contact embedded layer 14 via the gate wire 12.

When a bottom surface of the trench 13 is Si-face and a side surface of the trench 13 is a-face, it is possible to provide the $p^+$-type contact embedded layer 14 with such an impurity concentration that: a part of the $p^+$-type contact embedded layer 14 formed on the bottom surface of the trench 13 has a higher impurity concentration than another part of the $p^+$-type contact embedded layer 14 formed on the side surface of the trench 13. This comes from plane direction dependency of concentration of grown crystal, and the concentration of grown crystal on Si-face is larger than that on a-face. To achieve the above concentration relationship, a plane direction of the principal surface of the $n^+$-type SiC base 1 may be set to, for example, (0001) Si-face.

Because of the above configuration, a PN junction by a contact portion between the $p^+$-type contact embedded layer 14 and the $n^+$-type source layer 5 can have a high breakdown voltage (breakdown resistance). Furthermore, since the impurity concentration of the $p^+$-type contact embedded layer 14 can be kept high at a contact portion between the $p^+$-type contact embedded layer 14 and the embedded gate layer 10, it is possible to reduce a sheet resistance at the contact portion between the $p^+$-type contact embedded layer 14 and the embedded gate layer 10.

The impurity concentration can be all the same in a growth direction (thickness direction) of the $p^+$-type contact embedded layer 14. Alternatively, in order to improve a breakdown voltage at the contact portion between the $p^+$-type contact embedded layer 14 and the $n^+$-type source layer 5, the $p^+$-type contact embedded layer 14 may have such a concentration distribution that the impurity concentration gradually increases with increasing distance from the contact portion between the $p^+$-type contact embedded layer 14 and the $n^+$-type source layer 5. In this case, it is possible to provide a high breakdown voltage (breakdown resistance) to a PN junction by the contact portion between the contact portion of the $p^+$-type contact embedded layer 14 and the $n^+$-type source layer 5. Formation of the above structure may be difficult if the $p^+$-type contact embedded layer 14 is formed by ion implantation, because a conductivity type of the $n^+$-type source layer 5 needs to be inversed. However, the formation of the above structure can be carried out easily if the $p^+$-type contact embedded layer 14 is formed by epitaxial growth. Moreover, in the above configuration, the sheet resistance at a boundary portion between the p⁺-type contact embedded layer 14 and the embedded gate layer 10 can increase by a decrease in the impurity concentration of the p⁺-type contact embedded layer 14. For this reason, it may be preferable to set the impurity concentration of the p⁺-type contact embedded layer 14 in consideration of both of the breakdown voltage improvement and the sheet resistance increase of the PN junction. For example, approximately $10^{18}$ cm$^{-3}$ may be preferable.

A silicide layer 12a is provided as a part of the gate wire 12 contacting the top gate layer 9 or the embedded gate layer 10. The silicide layer 12a is formed by reaction of metal of at least a part of the gate wire 12 with Si in the top gate layer 9 or the embedded gate layer 10. Because of this silicide layer 12a, a contact resistance is reduced.

Through the contact hole 11c formed in the interlayer insulation film 11, a source electrode 15 contacts the n⁺-type source layer 5. A silicide layer 15a is provided as a part of the source electrode 15 contacting the n⁺-type source layer 5. The silicide layer 15a is formed by reaction of metal of at least a part of the source electrode 15 with Si in the n⁺-type source layer 5. Because of this silicide layer 15a, a contact resistance is reduced. The interlayer insulation film 16 is formed so as to cover the source electrode 15 and the gate wire 12. A source wire 17 is formed above the interlayer insulation film 16. A contact hole 16a is formed in the interlayer insulation film 16. The source wire 17 is electrically connected to the source electrode 15 through this contact hole 16a.

A drain electrode 18 contacts the rear surface of the n⁺-type SiC base 1 to constitute the JFET. The drain electrode 18 includes a Ti film, a Ni film and an Au film, which are laminated in turn. A silicide layer 18a is provided as a part of the drain electrode 18 contacting the n⁺-type SiC base 1. The silicide layer 18a is formed by reaction of metal of at least a part of the drain electrode 18 with Si in the n⁺-type SiC base 1. Because of this silicide layer 18a, a contact resistance is reduced. In order to protect the above-configured JFET, a surface of the JFET formation portion R1 is covered with a protection film 19.

The outer peripheral breakdown proof portion R2 is configured as follows. In the outer peripheral breakdown proof portion R2, the n⁺-type source layer 5 and the buffer layer 4 are removed from the semiconductor substrate 6. A p⁺-type layer 20 is formed on a surface of the p⁺-type SiC layer 3 from which these layers 4, 5 are removed. This p⁺-type layer 20 has, for example, a p-type impurity concentration of $1\times10^{18}$ cm$^{-3}$ to $1\times10^{20}$ cm$^{-3}$ (e.g., $1.0\times10^{19}$ cm$^{-3}$) and a thickness of 2.0 μm to 5.0 μm (e.g., 3.0 μm).

Multiple frame-shaped trenches 21 penetrating through the p⁺-type layer 20 and p⁺-type SiC layer 3 into the n⁻-type drift layer 2 and surrounding the JFET formation portion R1 are formed at regular intervals. Widths d1 to dn of the trenches 21 (where n is the number of trenches 21) are gradually widened with increasing distance away from the JFET formation portion R1.

Each trench 21 is filled with the interlayer insulation film 11 or the interlayer insulation film 16. In this way, a guard ring structure, in which a p-type region is divided into multiple regions by the trenches 21 and the insulation films 11, 16 in the trenches 21, is formed. A recess 22 is located outward than the guard ring structure. The recess 22 is formed on the semiconductor substrate 6 by removing the n⁺-type source layer 5 and the buffer layer 4, so that the recess 22 surrounds the guard ring structure. A wire portion 23 is arranged in this recess through the interlayer insulation film 11, 16. In this way, an EQR (Equi-Potential Ring) structure is formed. A surface of the above-configured outer peripheral breakdown proof portion R2 is covered with the protection film 19.

The JFET separation portion R3 is configured to transfer a breakdown current into the source wire 17 when a breakdown occurs at the outer peripheral breakdown proof portion R2 at time of reverse-bias; thereby the JFET separation portion R3 prevents the breakdown current from flowing into the JFET formation portion R1.

Specifically, the JFET separation portion R3 is configured as follows. In the JFET separation portion R3 also, the n⁺-type source layer 5 and the buffer layer 4 are removed from the semiconductor substrate 6. A p⁺-type layer 20 is formed on a surface of the p⁺-type SiC layer 3 from which the above layers 4, 5 are removed. Moreover, multiple frame-shaped trenches 31 penetrating through the p⁺-type layer 20 and p⁺-type SiC layer 3 into the n⁻-type drift layer 2 and surrounding the JFET formation portion R1 are formed at regular intervals. Each trench 31 is filled with the interlayer insulation film 11 or the interlayer insulation film 16. Furthermore, an extraction electrode 32 electrically connected to the p⁺-type layer 20 is formed at a place outward than the trench 31. This extraction electrode 32 is arranged above the interlayer insulation film 11, so that the extraction electrode 32 is electrically connected to the p⁺-type layer 20 through a contact hole 11d formed in the interlayer insulation film 11. Moreover, this extraction electrode 32 is electrically connected to the source wire 17 through a contact hole 16b formed in the interlayer insulation film 16. Because of this configuration, when a breakdown occurs at the outer peripheral breakdown proof portion R2 at a time of reverse-bias, it is possible to transfer a breakdown current into the source wire 17 via the extraction electrode 32.

A silicide layer 32a is provided as a part of the extraction electrode 32 contacting the p⁺-type layer 20. The silicide layer 32a is formed by reaction of metal of at least a part of the extraction electrode 32 with Si in the p⁺-type layer 20. Because of this silicide layer 32a, a contact resistance is reduced.

The SiC semiconductor device with the JFET is configured to have the above-described structure. In the above-configured SiC semiconductor device with the JFET, when a gate voltage is not applied to the top gate layer 9 and the embedded gate layer 10 via the gate wire 12, the channel layer 8 is pinched off due to a depletion layer extending from the top gate layer 9 and the embedded gate layer 10 toward the channel layer 8. From this state, when the gate voltage is applied to the top gate layer 9 and the embedded gate layer 10 via the gate wire 12, the depletion layer extending from the top gate layer 9 and the embedded gate layer 10 is reduced. Accordingly, a channel region is formed in the channel layer 8, and a current flows between the source electrode 15 and the drain electrode 18 through the channel region. In this way, the JFET of the present embodiment can function as a normally-off type element.

Figure 27:
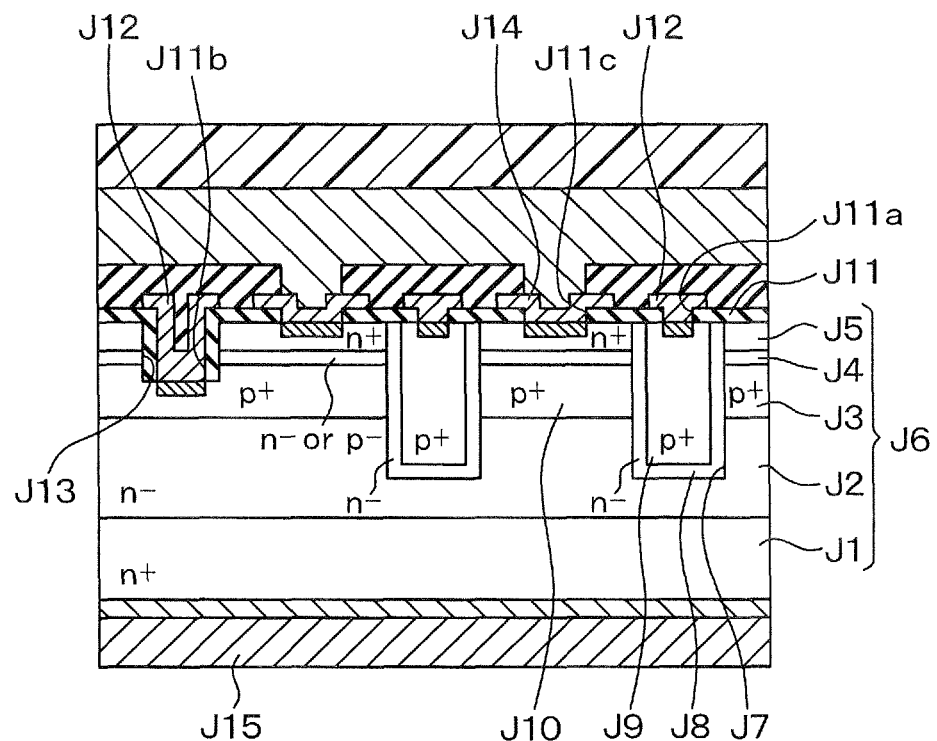
FIG. 27 is a diagram illustrating a JFET of a SiC semiconductor device of a related art.

In the above-configured SiC semiconductor device, an electrical connection between the embedded gate layer 10 and the gate wire 12 is made by the p⁺-type contact embedded layer 14. Accordingly, width of the trench 13, in which only the p⁺-type contact embedded layer 14 is arranged, can be narrowed, as compared with the trench J13 in the conventional SiC semiconductor device illustrated in FIG. 27 where the interlayer insulation film J11 and the gate wire J12 are arranged in the trench J13.

Next, a manufacturing method of the above-configured SiC semiconductor device with JFET of the present embodiment will be described. FIGS. 2 to 22 are sectional views illustrating manufacturing processes of the SiC semiconductor device with JFET of the present embodiment. In FIGS. 2 to 22, each of the JFET formation portion R1, the outer peripheral breakdown proof portion R2 and the JFET separation portion R3 during the manufacturing processes is shown, and further, an alignment key portion R4 for alignment at trench forming or patterning is shown. The trench formation, the patterning and the like are carried out with reference to a recess formed in the alignment key portion R4 although a specific explanation on the alignment key portion R4 may not given in the below description.

Figure 2:
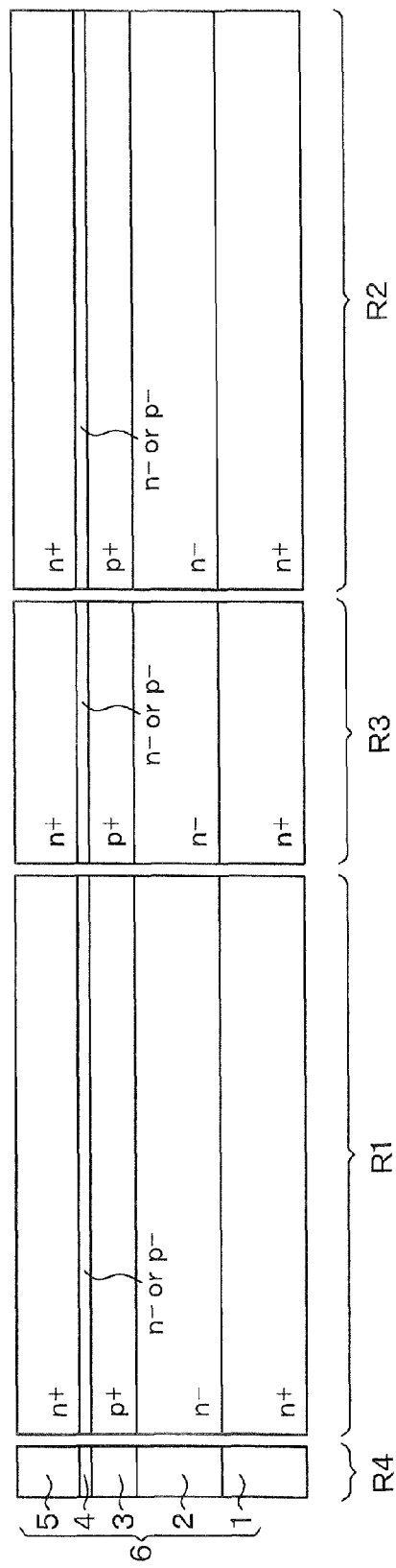
FIG. 2 is a sectional view illustrating a manufacturing process of an SiC semiconductor device illustrated in FIG. 1.

First, as shown in FIG. 2, the semiconductor substrate 6 is prepared in which the n⁻-type drift layer 2, p⁺-type SiC layer 3, the buffer layer 4, and the n⁺-type source layer 5 are formed, in turn, on the surface of n⁺-type SiC base 1. Here, the n⁻-type drift layer 2 has the n-type impurity concentration of $5.0 \times 10^{18}$ cm$^{-3}$, and the thickness of 13.0 µm. The p⁺-type SiC layer 3 has the p-type impurity concentration of $5.0 \times 10^{18}$ cm$^{-3}$ and the thickness of 1.4 µm. The buffer layer 4 has the n-type or p-type impurity concentration of $1.0 \times 10^{18}$ cm$^{-3}$ and the thickness is 0.3 µm. The n⁺-type source layer 5 has the n-type impurity concentration of $2.0 \times 10^{19}$ cm$^{-3}$ and the thickness of 1.4 µm. The thicknesses of the n⁻-type drift layer 2, the p⁺-type SiC layer 3 and the buffer layer 4 are the same as those at completion of the SiC semiconductor device illustrated in FIG. 1; however, the n⁺-type source layer 5 is thicker than that at the completion of the SiC semiconductor device illustrated in FIG. 1.

Figure 3:
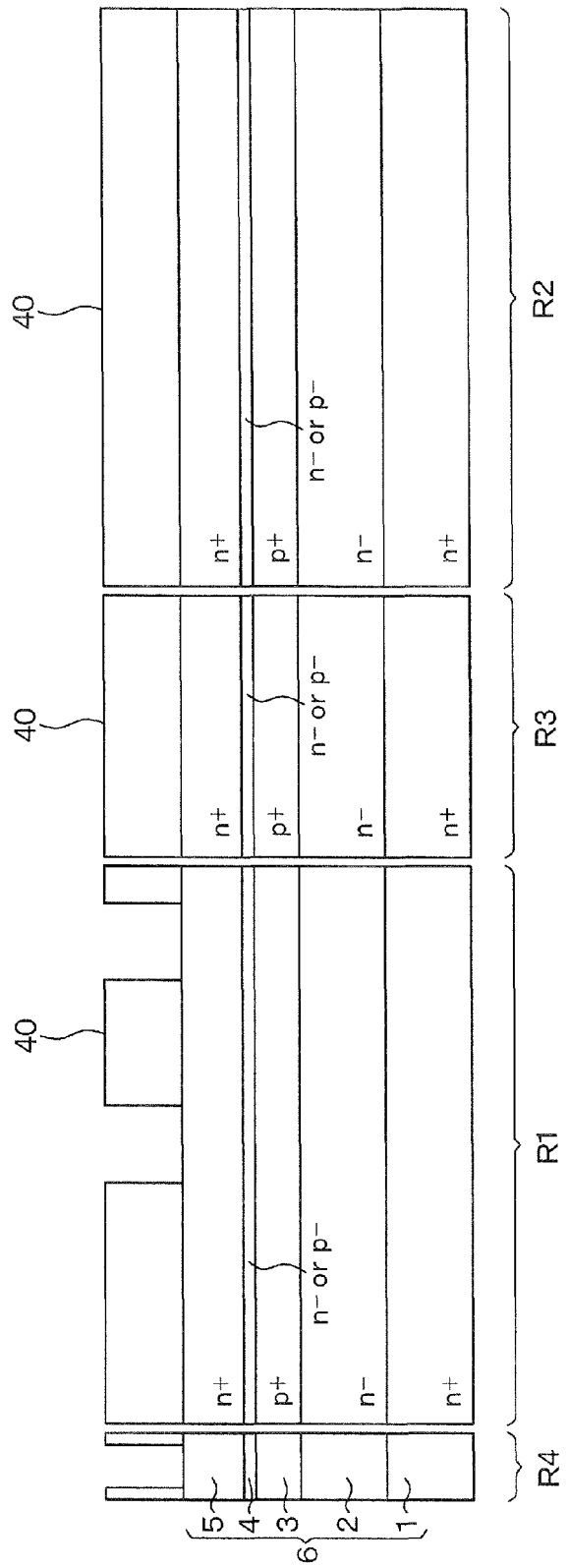
FIG. 3 is a sectional view illustrating a manufacturing process of the SiC semiconductor device subsequent to FIG. 2.
Figure 4:
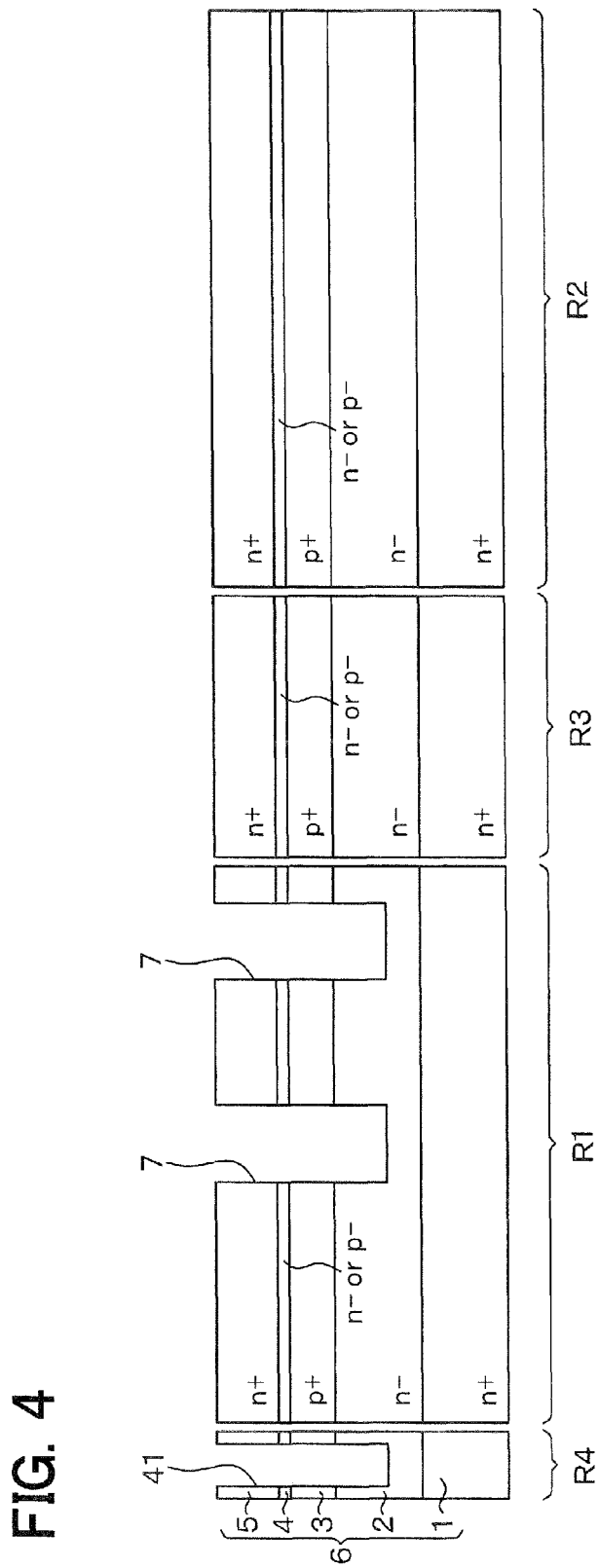
FIG. 4 is a sectional view illustrating a manufacturing process of the SiC semiconductor device subsequent to FIG. 3.

Then, as shown in FIG. 3, a mask film 40 having a thickness of for example approximately 2 µm is formed on a surface of the semiconductor substrate 6, i.e., on a surface of the n⁺-type source layer 5. The mask film may a TEOS film etc. Then, the mask film 40 is patterned by a photo-process, and openings are formed at an area where the trench 7 is to be formed in the semiconductor substrate 6, and at area where the alignment-key portion R4 is to be formed. Then, as shown in FIG. 4, dry etching using the mask film 40 as a mask is performed, so that the trench 7 and the alignment key 41 are formed with such depth as to penetrate through the p⁺-type SiC layer 3, the buffer layer 4 and the n⁺-type source layer 5 into the n⁻-type drift layer 2. Then, the mask film 40 is removed.

Figure 5:
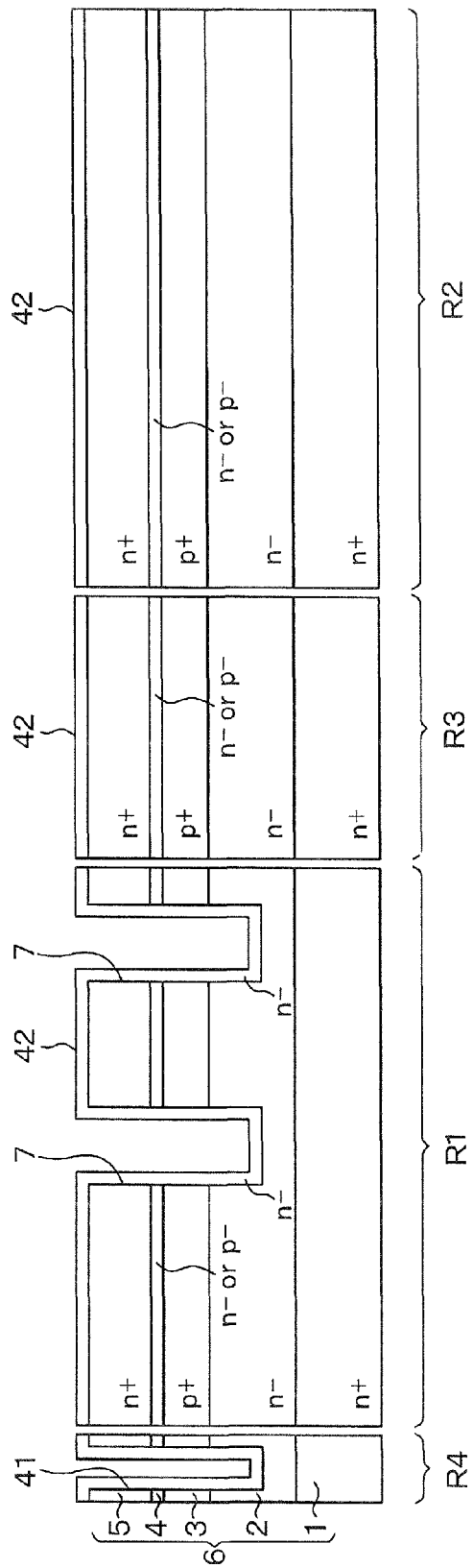
FIG. 5 is a sectional view illustrating a manufacturing process of the SiC semiconductor device subsequent to FIG. 4.
Figure 6:
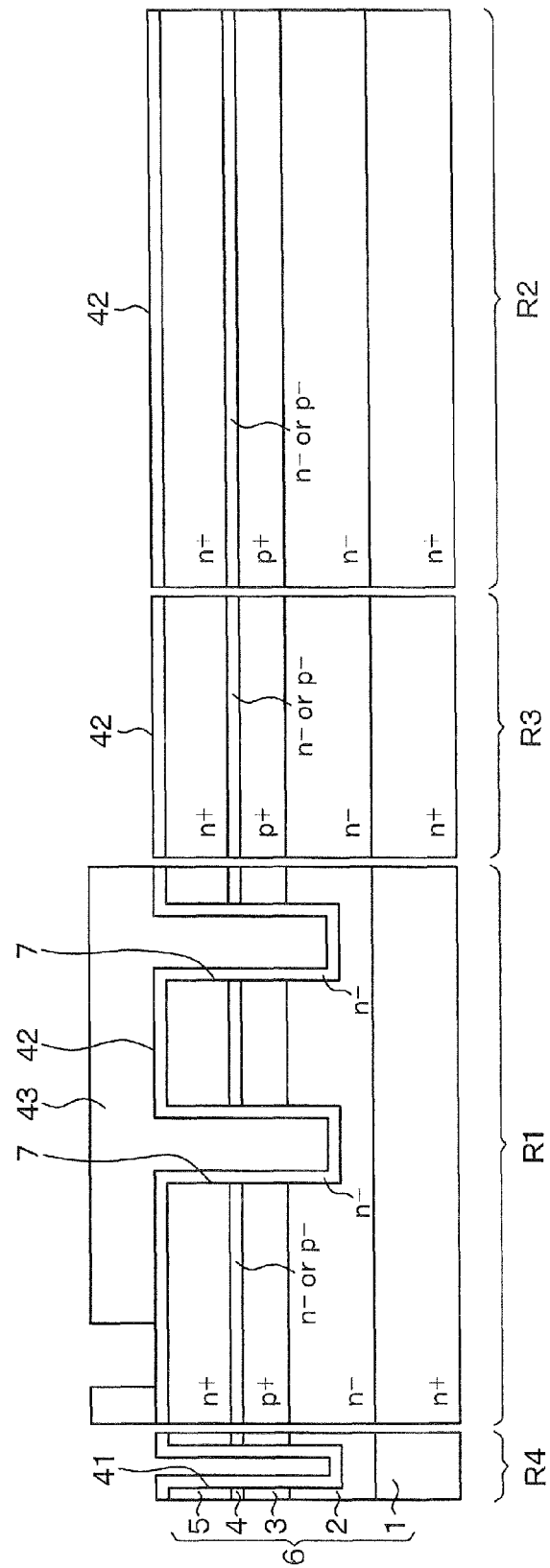
FIG. 6 is a sectional view illustrating a manufacturing process of the SiC semiconductor device subsequent to FIG. 5.
Figure 7:
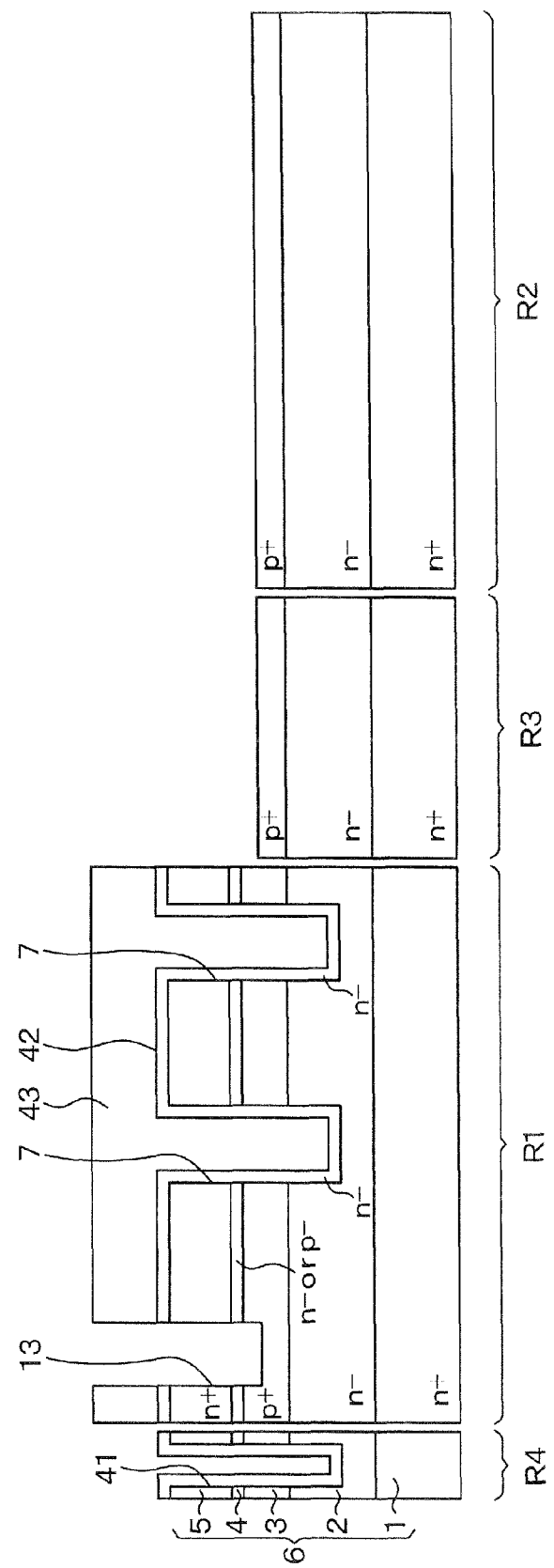
FIG. 7 is a sectional view illustrating a manufacturing process of the SiC semiconductor device subsequent to FIG. 6.

Next, as shown by FIG. 5, an n⁻-type layer 42 for forming the channel layer 8 is epitaxially grown. In this epitaxial growth, the n⁻-type layer 42 having, for example, the n-type impurity concentration of $1 \times 10^{16}$ cm$^{-3}$ to $5 \times 10^{17}$ cm$^{-3}$ (e.g., $1 \times 10^{17}$ cm$^{-3}$) and the thickness of 0.1 µm to 1.0 µm (e.g., 0.3 µm) is formed on an entire surface of the semiconductor substrate 6 including an inside of the trench 7 and an inside of the alignment key 41. Furthermore, as shown in FIG. 6, after a mask film 43 such as a TEOS film and the like is formed on a surface of the n⁻-type layer 42, the mask film 43 is patterned, so that openings are formed at an area where the outer peripheral breakdown proof portion R2 is to be formed and at an area where the JFET separation portion R3 is to be formed, in addition to an area where the trench 13 is to be formed. Then, as shown in FIG. 7, by dry etching using the mask film 43 as a mask, the trench 13 penetrating through the n⁻-type layer 42, the n⁺-type source layer 5 and the buffer layer 4 into the p⁺-type SiC layer 3 is formed, and the p⁺-type SiC layer 3 is exposed by removing the n⁺-type source layer 5 and the buffer layer 4 in the outer peripheral breakdown proof portion R2 and the JFET separation portion R3. In the above, in order to surely expose the p⁺-type SiC layer 3, the dry-etched thickness is set larger than the thickness of the n⁺-type source layer 5 and that of the buffer layer 4. Then, the mask film 43 is removed.

Figure 8:
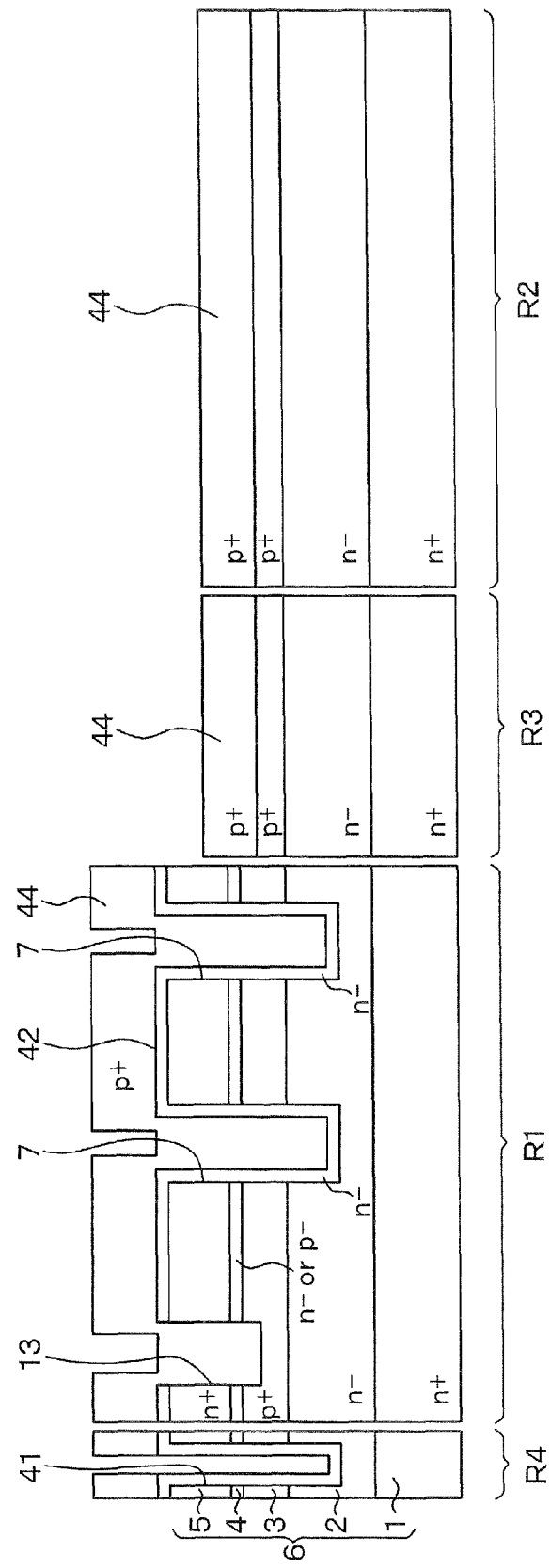
FIG. 8 is a sectional view illustrating a manufacturing process of the SiC semiconductor device subsequent to FIG. 7.
Figure 9:
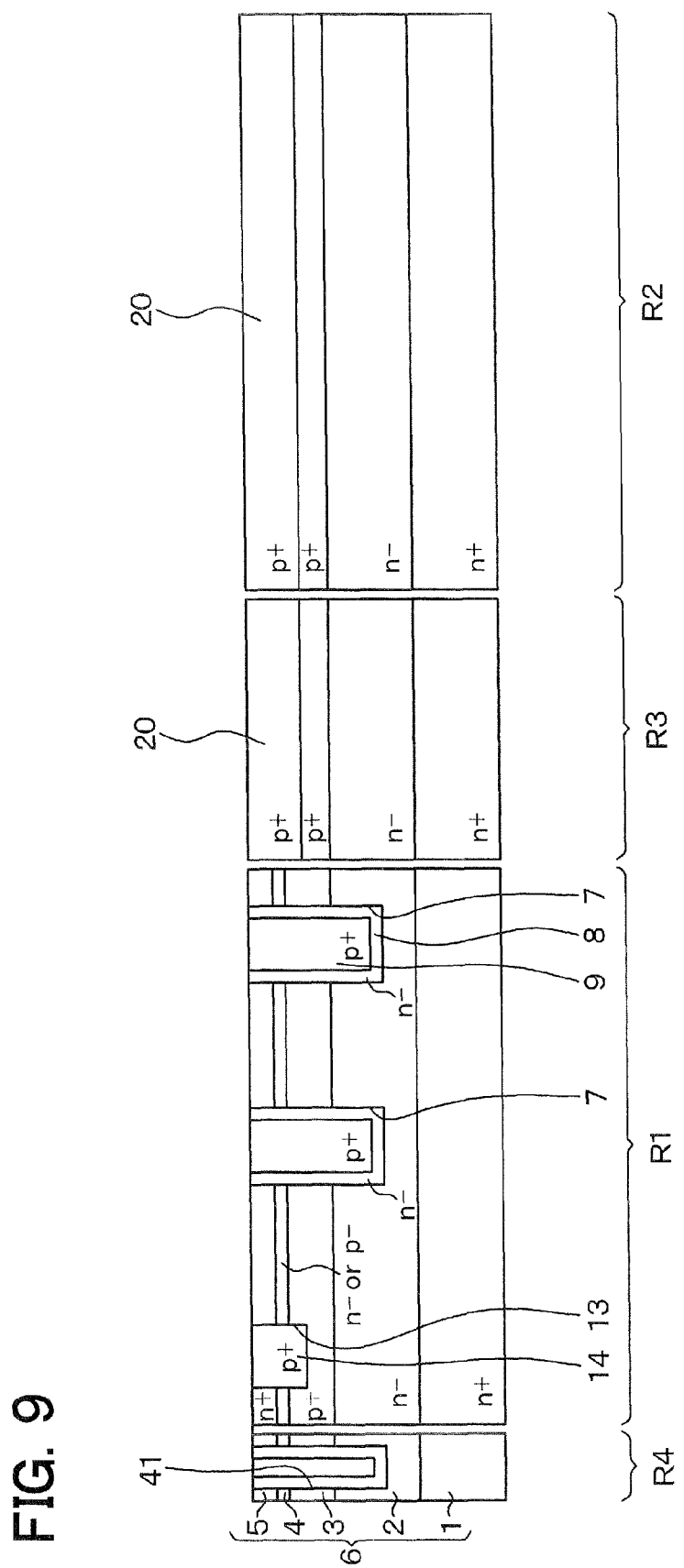
FIG. 9 is a sectional view illustrating a manufacturing process of the SiC semiconductor device subsequent to FIG. 8.

Then, as shown in FIG. 8, the p⁺-type layer 44 having, for example, the p-type impurity concentration of $1 \times 10^{18}$ cm$^{-3}$ to $1 \times 10^{20}$ cm$^{-3}$ (e.g., $1.0 \times 10^{19}$ cm$^{-3}$) and the thickness of 2.0 µm to 5.0 µm (e.g., 3.0 µm) is epitaxially grown on an entire surface of the semiconductor substrate 6 including a surface of the n⁻-type layer 42, and an inside of the trench 13, the outer peripheral breakdown proof portion R2 and the JFET separation portion R3. Accordingly, the p⁺-type layer 44 is formed even on the surface of the n⁻-type layer 42 in the trench 7, and the trench 7 is filled with the n⁻-type layer 42 and the p⁺-type layer 44. In addition, the surface of the p⁺-type layer 44 becomes located above the surface of the buffer layer 4. Then, as shown in FIG. 9, the p⁺-type layer 44, the n⁻-type layer 42 and the n⁺-type source layer 5 are planarized by mechanical polishing for surface planarization. In the above, if the surface of the semiconductor substrate 6 in the JFET formation portion R1 is polished to the depth of a surface of the p⁺-type layer 44 in the outer peripheral breakdown proof portion R2 and the JFET separation portion R3, it is possible to prevent the p⁺-type layer 44 and the n⁻-type layer 42 from remaining on the surface of the n⁺-type source layer 5 while it is possible to allow the n⁺-type source layer 5 to remain. Then, on an as-needed basis, a desired-thickness surface portion is removed by RIE (Reactive Ion Etching), and removal thickness is adjusted by surface planarization. Then, surface polishing is performed by CMP (Chemical Mechanical Polishing). In this way, the channel layer 8, the top gate layer 9, and the p⁺-type contact embedded layer 14 are formed from the p⁺-type layer 44 and the n⁻-type layer 42 remaining in the trenches 7 and 13.

Figure 10:
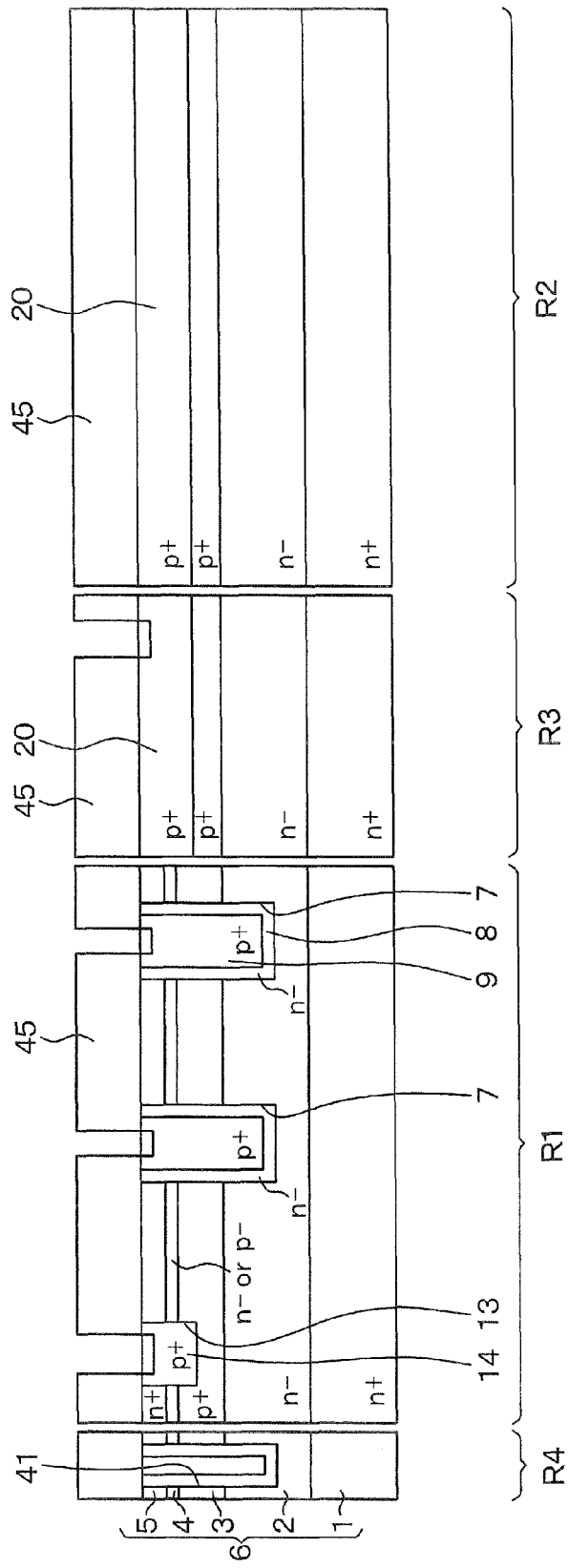
FIG. 10 is a sectional view illustrating a manufacturing process of the SiC semiconductor device subsequent to FIG. 9.
Figure 11:
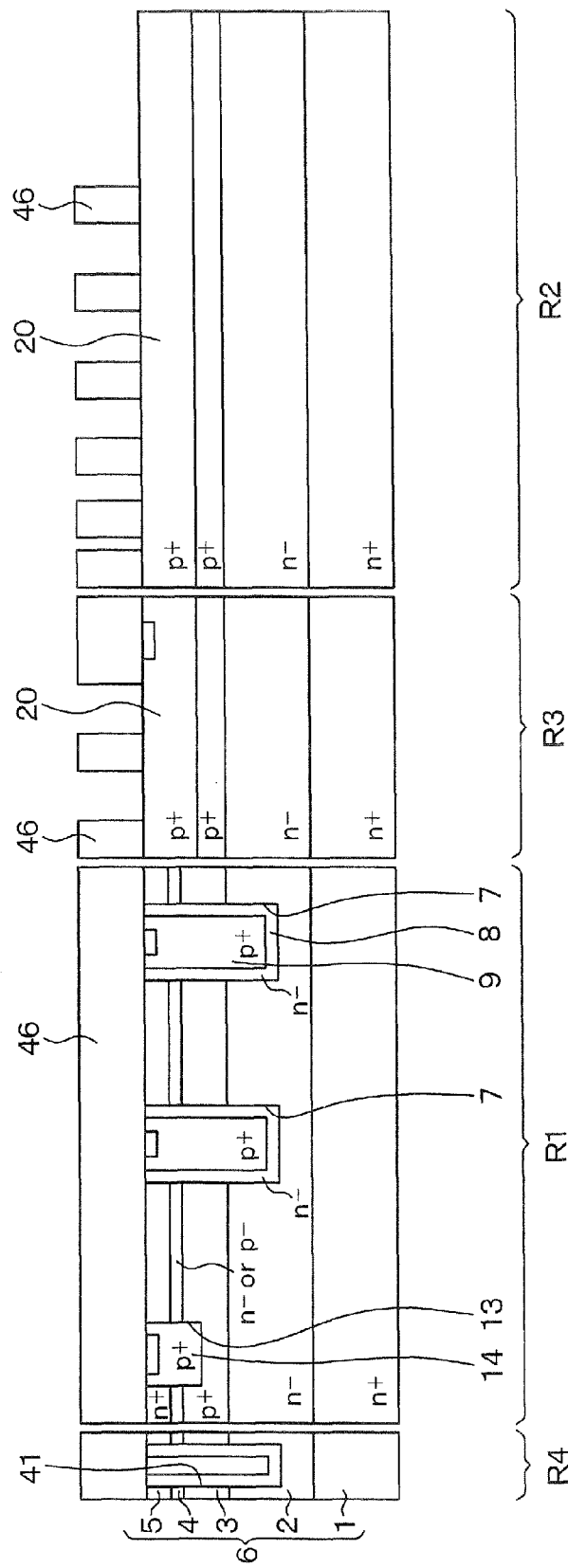
FIG. 11 is a sectional view illustrating a manufacturing process of the SiC semiconductor device subsequent to FIG. 10.
Figure 12:
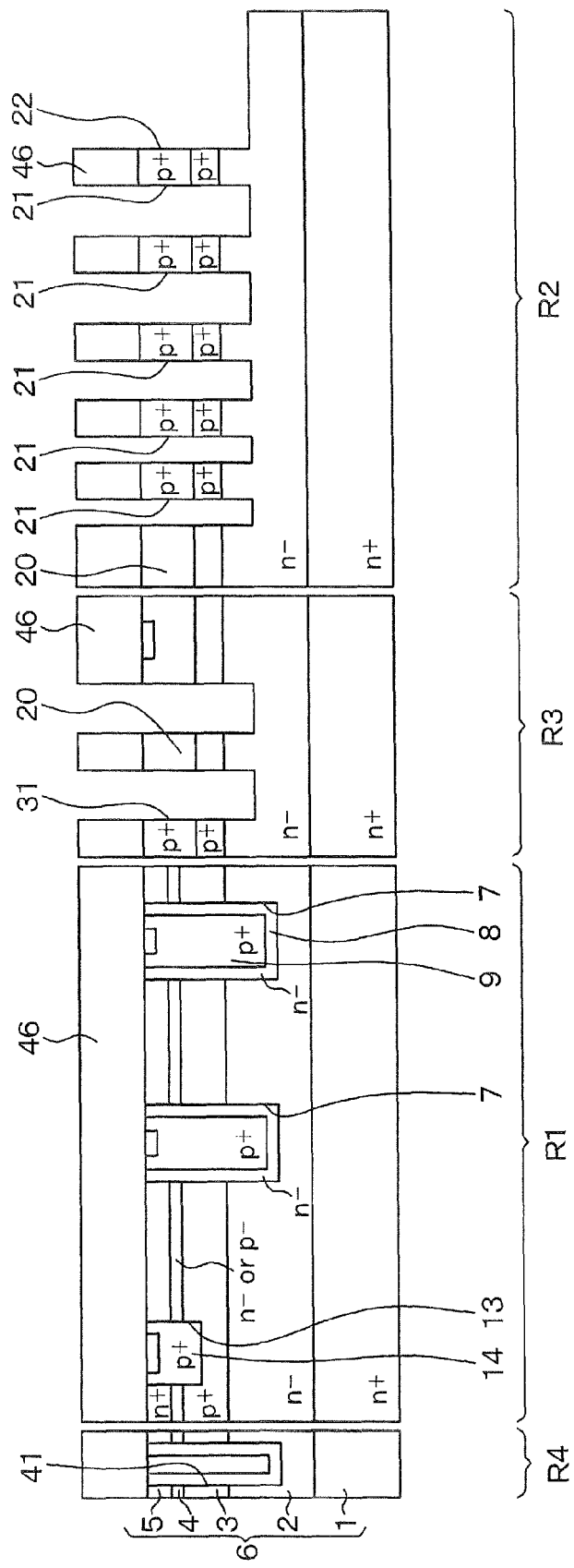
FIG. 12 is a sectional view illustrating a manufacturing process of the SiC semiconductor device subsequent to FIG. 11.

Next, as shown in FIG. 10, a mask film 45 such as a TEOS film etc. is formed to have a thickness of, for example, approximately 2 µm on a surface of the semiconductor substrate 6. Then, the mask film 45 is patterned by a photo-process, so that openings are formed above the top gate layer 9, the p⁺-type contact embedded layer 14, and a surface of the p⁺-type layer 20 in the JFET separation portion R3. Then, by ion implantation of Al ions, the p-type impurity concentrations of the top gate layer 9, the p⁺-type contact embedded layer 14, and the p⁺-type layer 20 in the JFET separation portion R3 are increased. In the above, an ion-implanted region has, for example, the p-type impurity concentration of $1 \times 10^{20}$ cm$^{-3}$ to $5 \times 10^{20}$ cm$^{-3}$ (e.g., $4.0 \times 10^{20}$ cm$^{-3}$) and the thickness of 0.1 µm to 0.5 µm (e.g., 0.3 µm). Then, the mask film 45 is removed, and another mask film 46 such as a TEOS film etc. is formed to have, for example, a thickness of 2 µm on a surface of the semiconductor substrate 6 as shown in FIG. 11. Then, the mask film 46 is patterned by a photo-process, so that openings are formed at areas where the trench 21 and the recess 22 in the outer peripheral breakdown proof portion R2 are to be formed and at an area where the trench 31 in the JFET separation portion R3 is to be formed. Then, as shown in FIG. 12, with the use of the mask film 46 as a mask, dry etching is performed to form the trench 21, the recess 22 and the trench 31, which penetrate through the p⁺-type layer 20 and the p⁺-type SiC layer 3 into the n⁻-type drift layer 2. Then, the mask film 46 is removed.

Figure 13:
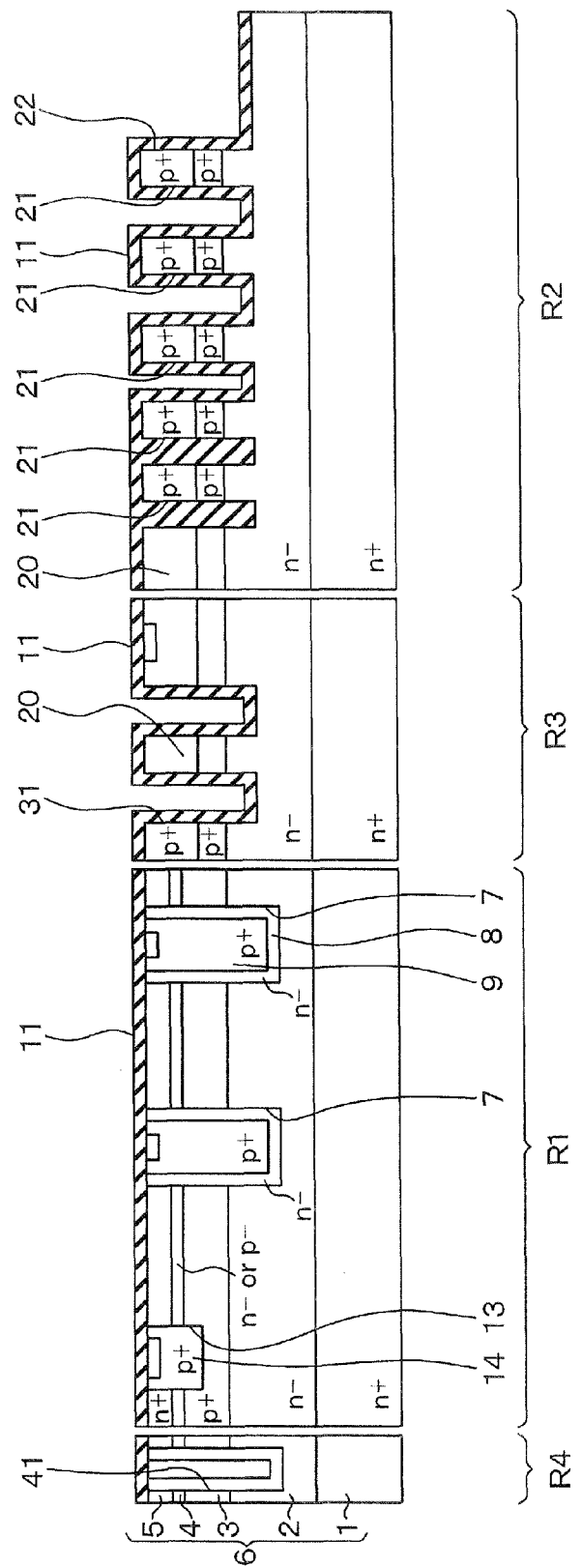
FIG. 13 is a sectional view illustrating a manufacturing process of the SiC semiconductor device subsequent to FIG. 12.
Figure 14:
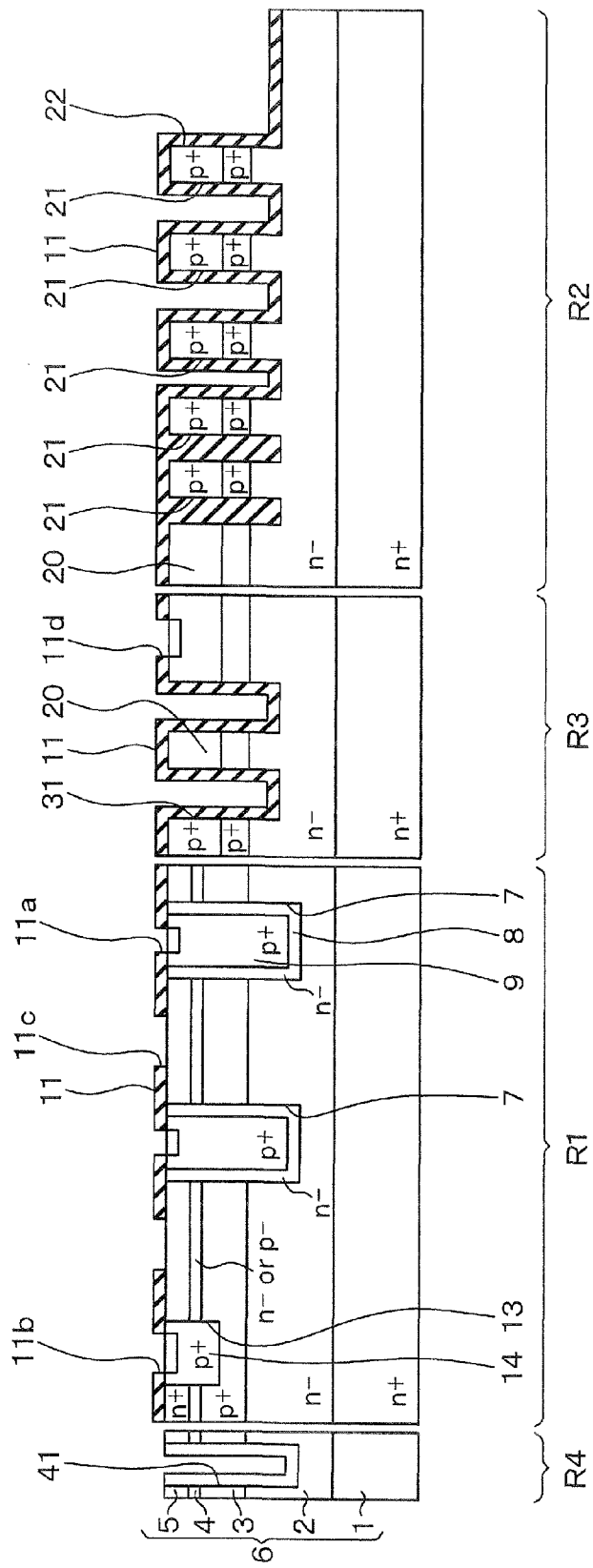
FIG. 14 is a sectional view illustrating a manufacturing process of the SiC semiconductor device subsequent to FIG. 13.
Figure 15:
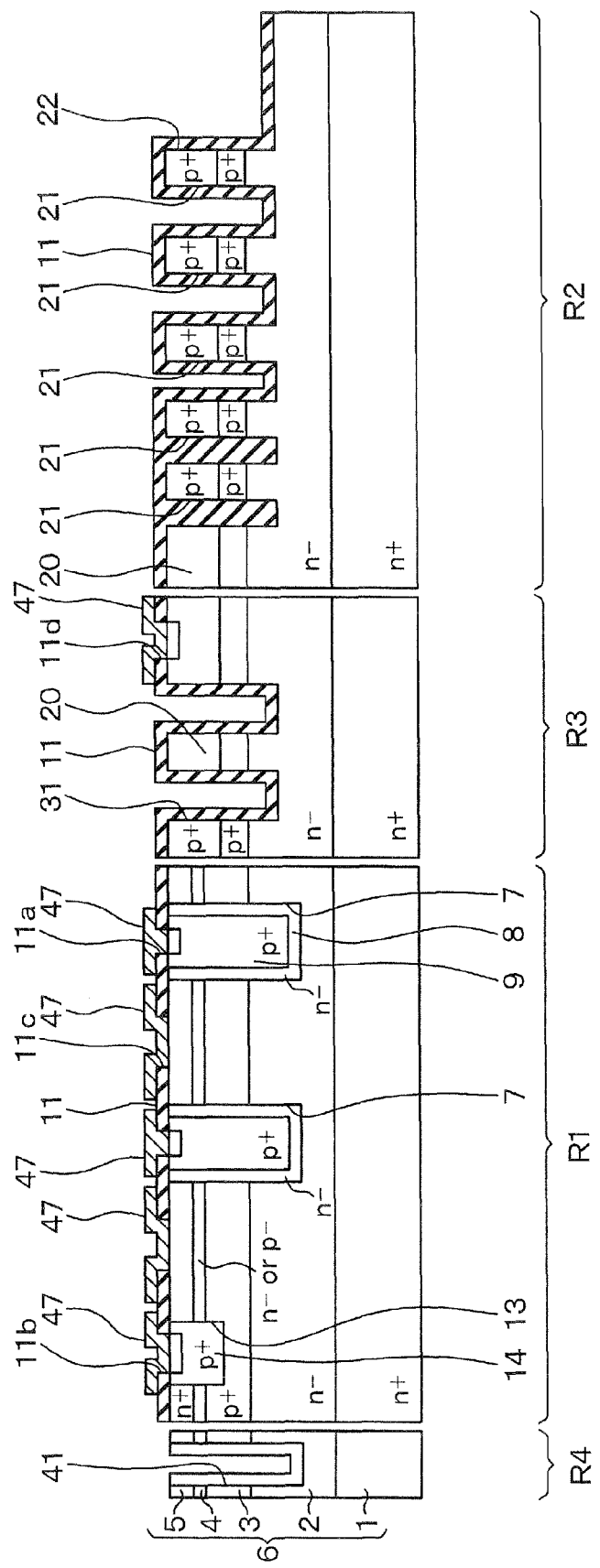
FIG. 15 is a sectional view illustrating a manufacturing process of the SiC semiconductor device subsequent to FIG. 14.
Figure 16:
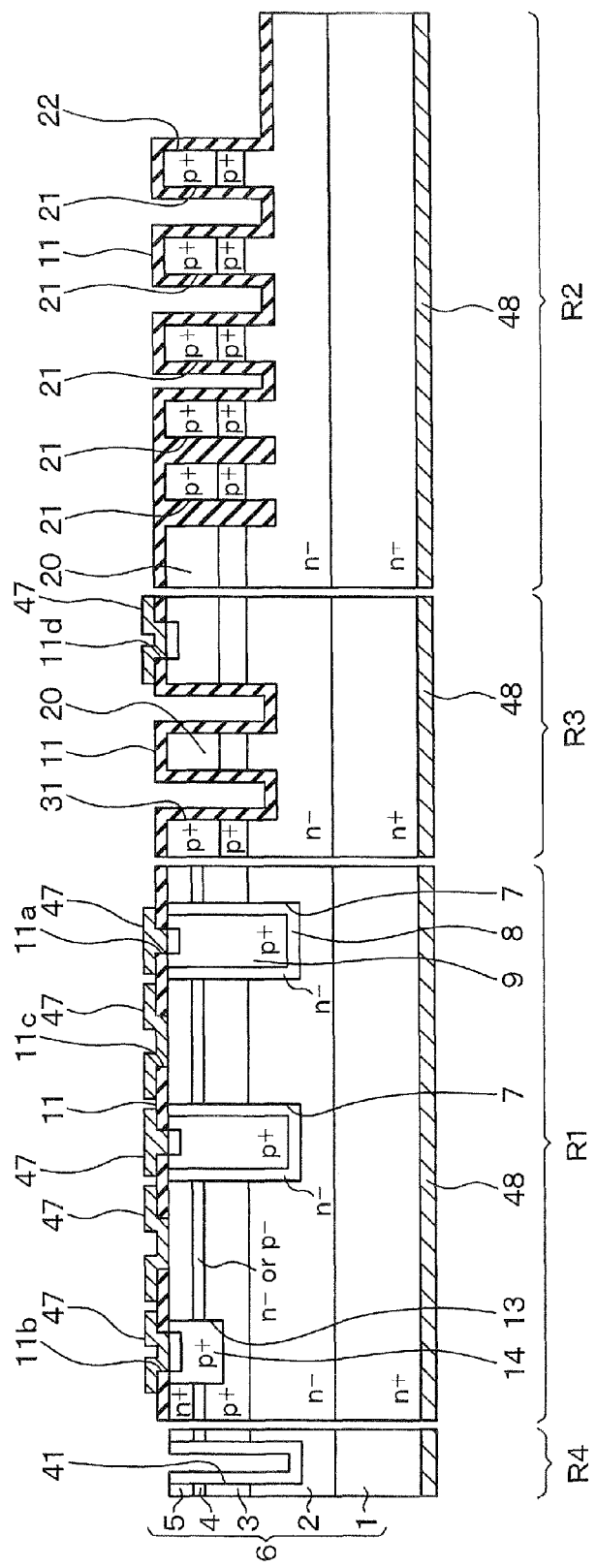
FIG. 16 is a sectional view illustrating a manufacturing process of the SiC semiconductor device subsequent to FIG. 15.
Figure 17:
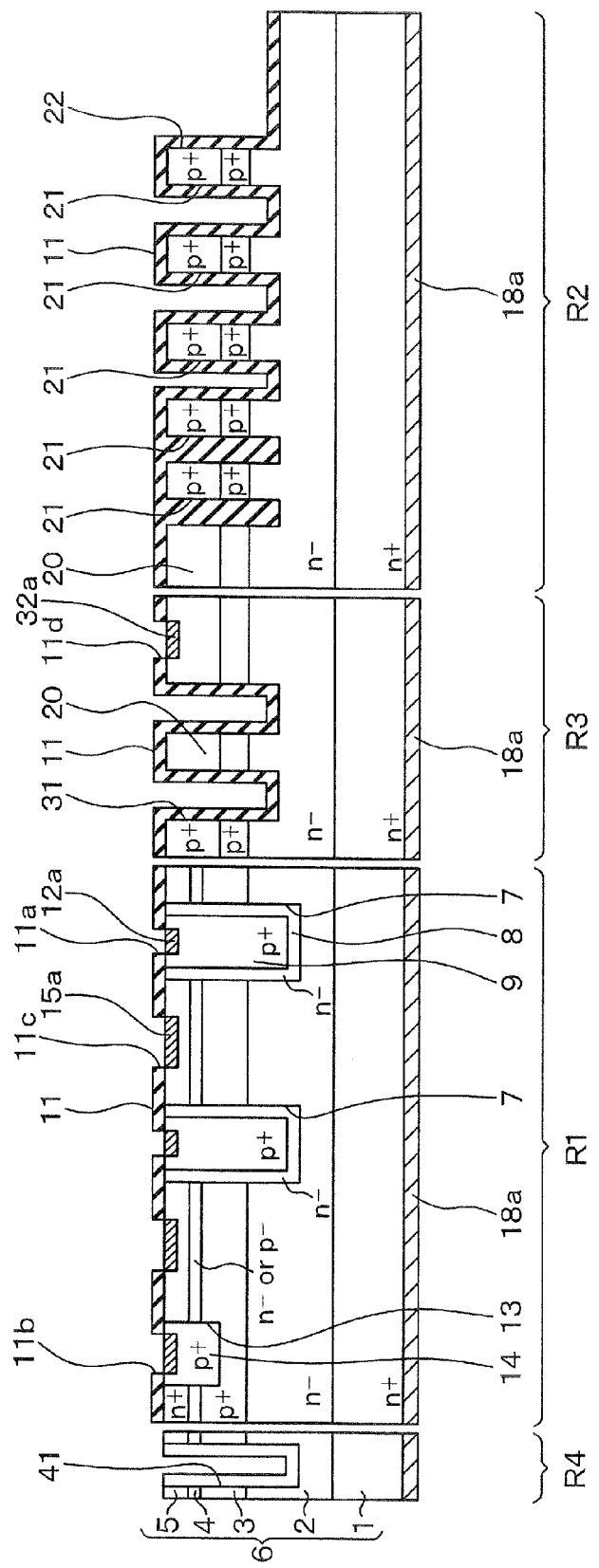
FIG. 17 is a sectional view illustrating a manufacturing process of the SiC semiconductor device subsequent to FIG. 16.

Then, as shown in FIG. 13, the interlayer insulation film 11 including a LTO film etc. is formed, and then, a rear side of the semiconductor substrate 6 is grinded. That is, an surface of the n⁺-type SiC base 1 opposite to a surface where the n⁻-type drift layer 2 is formed is grinded. Then, using a mask (not shown), the interlayer insulation film 11 is pattered and the contact holes 11a to 11d are formed as shown in FIG. 14. Further, as shown in FIG. 15, a metal film 47 made of a metal material causing a silicidation reaction such as Ni and the like is formed on a surface of the interlayer insulation film 11 including insides of the contact holes 11a to 11d. Then, the metal film 47 is patterned, so that the metal film 47 remains on the insides of the contact holes 11a to 11d and their surroundings. Further, as shown in FIG. 16, a metal film 48 made of the metal material causing a silicidation reaction such as Ni and the like is formed on the rear surface of the semiconductor substrate 6. Then, by performing a silicidation process by heat treatment, the metal materials of the metal film 47 and the metal film 48 are reacted with Si in SiC by silicidation. For example, the heat treatment is performed at 1000 degree C. for 10 min. Thereby, as shown in FIG. 17, the silicide layers 12a, 15a, 32a are formed on a front side of the semiconductor substrate 6 and the silicide layer 18a is formed on the rear side of the semiconductor substrate 6. Then, un-reacted parts of the metal films 47, 48 are removed.

Figure 18:
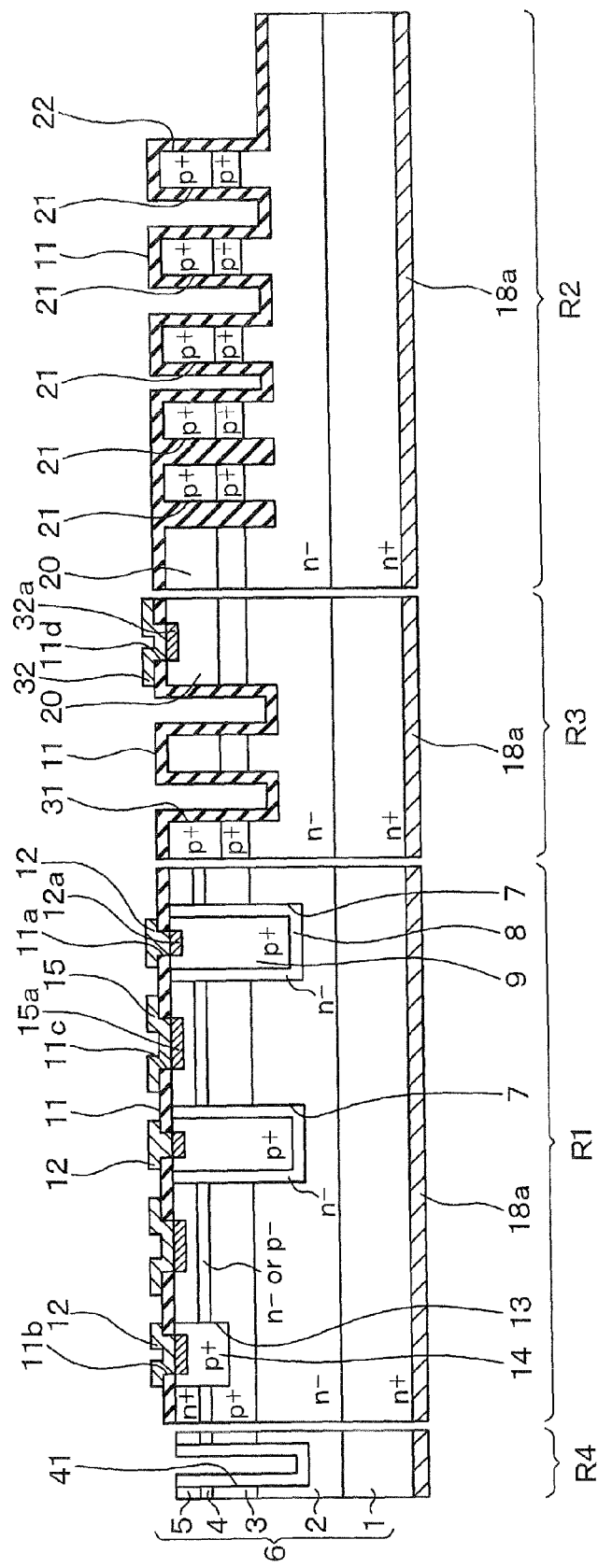
FIG. 18 is a sectional view illustrating a manufacturing process of the SiC semiconductor device subsequent to FIG. 17.
Figure 19:
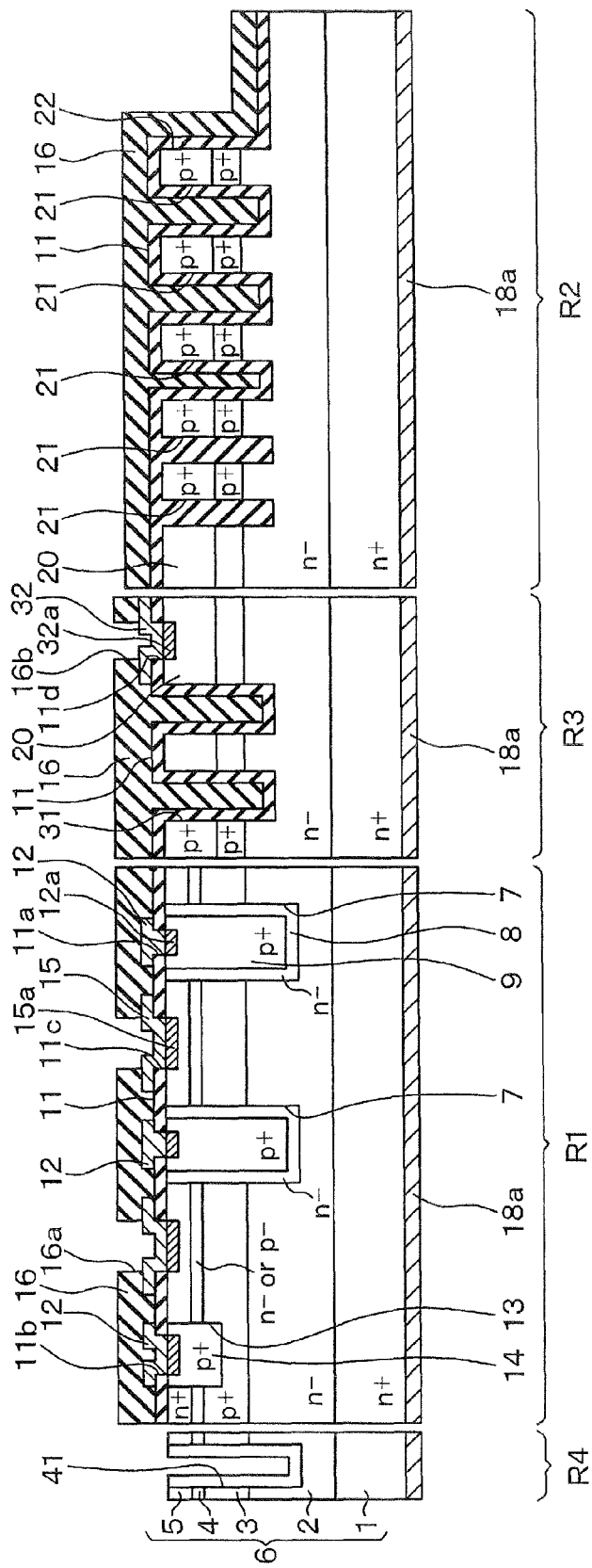
FIG. 19 is a sectional view illustrating a manufacturing process of the SiC semiconductor device subsequent to FIG. 18.

As shown in FIG. 18, a metal film made of a metal material such as Ti and the like is formed on a surface of the interlayer insulation film 11 including insides of the contact holes 11a to 11d. Then, this metal film is patterned, so that the gate wire 12, the source electrode 15 and the extraction electrode 32 are formed. Then, as shown in FIG. 19, the interlayer insulation film 16 including a LTO film etc. is formed and patterned, so that a contact hole 16a for exposing the source electrode 15 is formed and a contact hole 16b for exposing the extraction electrode 32 is formed.

Figure 20:
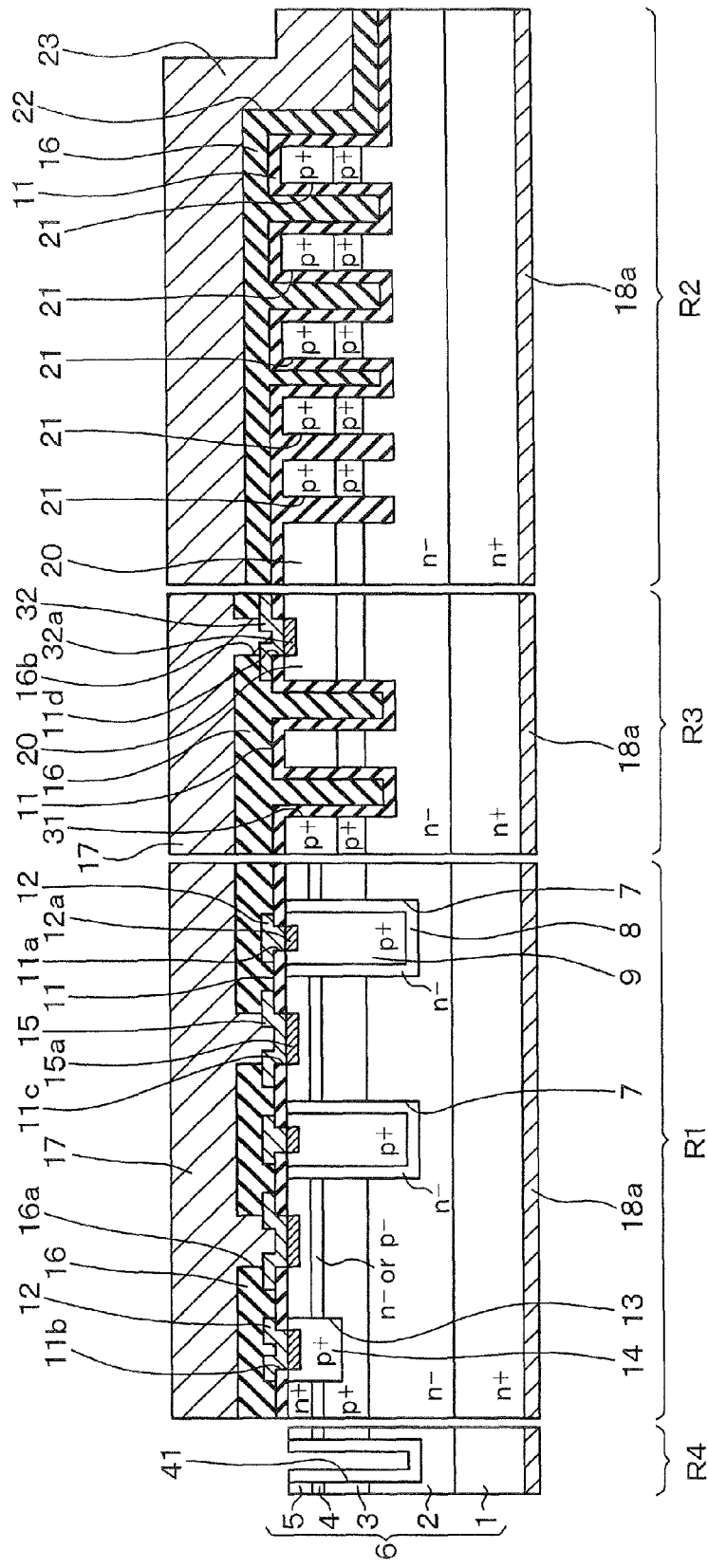
FIG. 20 is a sectional view illustrating a manufacturing process of the SiC semiconductor device subsequent to FIG. 19.
Figure 21:
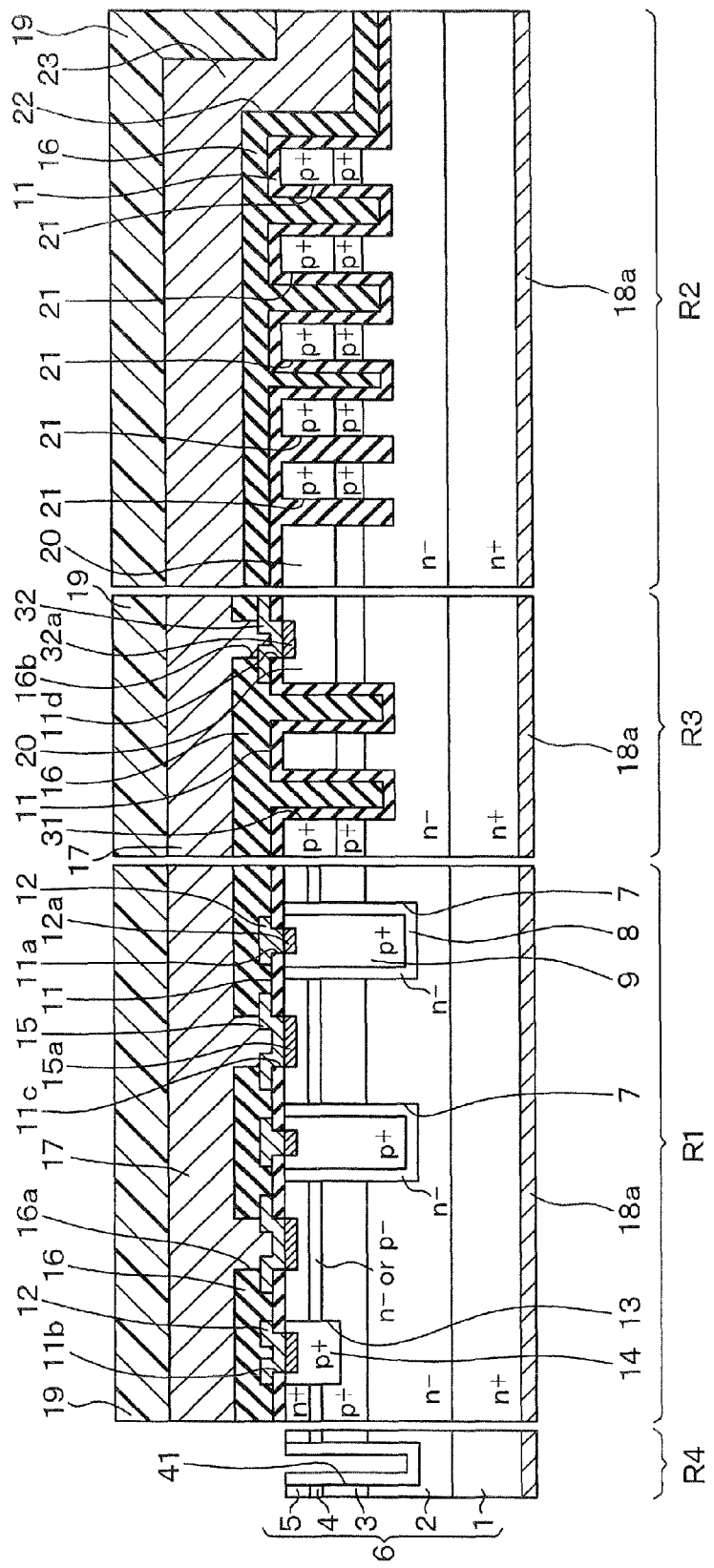
FIG. 21 is a sectional view illustrating a manufacturing process of the SiC semiconductor device subsequent to FIG. 20.
Figure 22:
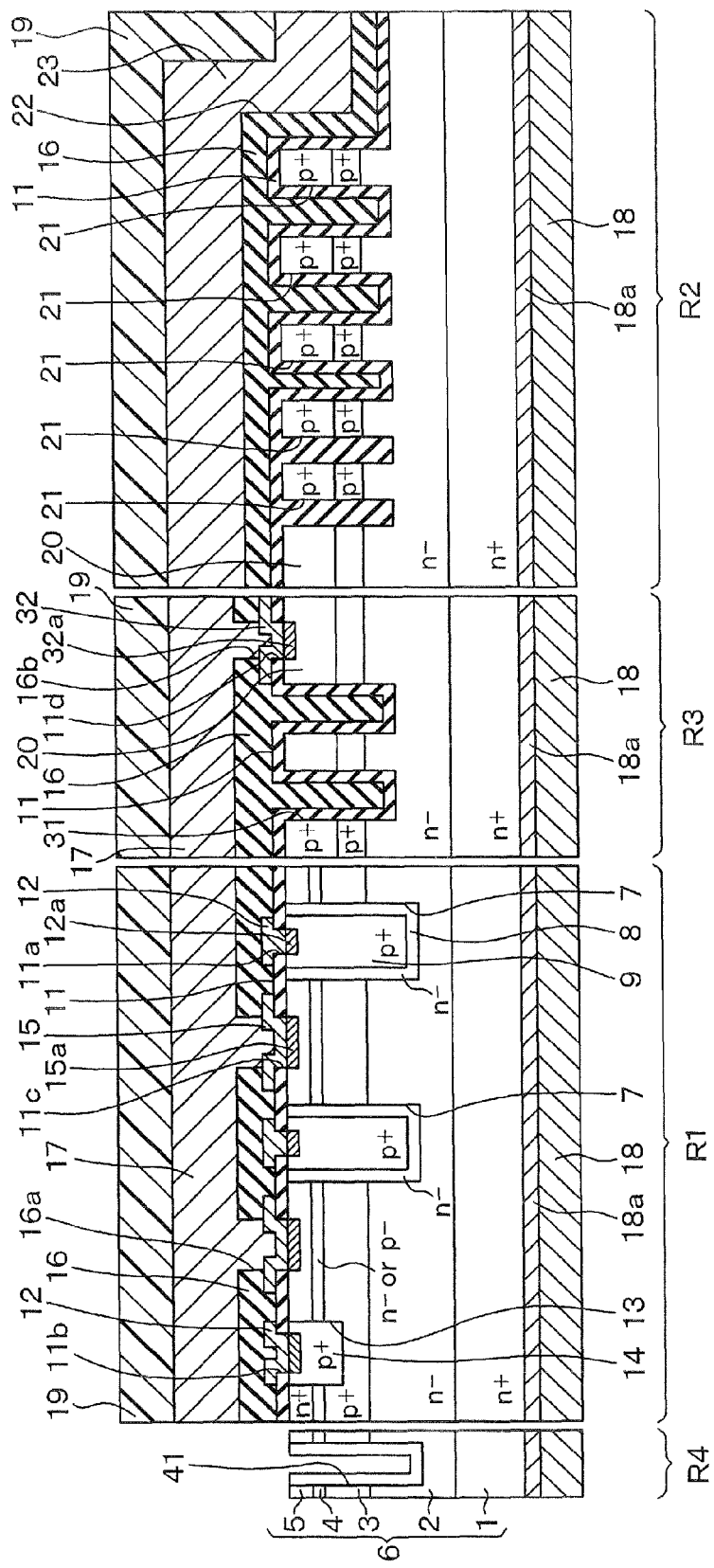
FIG. 22 is a sectional view illustrating a manufacturing process of the SiC semiconductor device subsequent to FIG. 21.

Moreover, as shown in FIG. 20, a wire-material film made of Al etc. is formed and patterned, so that the source wire 17 and the wire portion 23 are formed. Then, as shown in FIG. 21, the protection film 19 including a polyimide resin film (PIQ film) etc. is formed so as to cover the source wire 17 and the wire portion 23. Then, as shown in FIG. 22, the drain electrode including a Ti film, an Ni film and an Au film stacked in turn on the rear surface of the semiconductor substrate 6 is formed. Dicing cut is carried out in units of chip. Accordingly, the SiC semiconductor device with the JFET illustrated in FIG. 1 is completed.

In the above-explained SiC semiconductor device with the JFET of the present embodiment, as described above, the electrical connection between the embedded gate layer 10 and the gate wire 12 is made by the $p^+$-type contact embedded layer 14. Because of this, the width of the trench 13, in which only the $p^+$-type contact embedded layer 14 is arranged, can be narrowed down as compared with the width of the trench J13 of the SiC semiconductor device of the related art in FIG. 27 in which the interlayer insulation film J11 and the gate wire J12 etc are arranged in the trench J13. Therefore, the SiC semiconductor device with the JFET can downsize the contact structure between the embedded gate layer 10 and the gate wire 12.

In addition, in connection with the outer peripheral breakdown proof portion R2, the following advantage is achievable. This will be described with reference to FIG. 23.

FIG. 23A is a sectional view of the outer peripheral breakdown proof portion R2 in which the p-type region of the guard ring structure is formed using the $p^+$-type SiC layer 3 and the $p^+$-type layer 20. FIG. 23B is a sectional view of the outer peripheral breakdown proof portion R2 in which the p-type region of the guard ring structure is formed using only the $p^+$-type SiC layer 3. As shown in FIGS. 23A and 23B, the p-type region of the guard ring structure can be formed using the $p^+$-type SiC layer 3 and the $p^+$-type layer 20 or using only the $p^+$-type SiC layer 3. However, as shown in FIG. 23B, when the p-type region is formed using only the $p^+$-type SiC layer 3, it is conceivable that the $p^+$-type SiC layer 3 is made to be too thin at the process illustrated in FIG. 7. In contrast, when not only the $p^+$-type SiC layer 3 but also the $p^+$-type+ type layer 20 are arranged as the p-type region, it is possible to ensure enough thickness of the p-type region for constituting the guard ring structure. Moreover, if the p-type region constituting the guard ring structure is formed using only the $p^+$-type SiC layer 3, the height of the surface location of the JFET formation portion R1 of the semiconductor substrate 6 cannot coincide with the surface location of the guard ring structure in the outer peripheral breakdown proof portion R2. In contrast, if the p-type region constituting the guard ring structure is formed using the $p^+$-type SiC layer 3 and the $p^+$-type layer 20, the height of the surface location of the JFET formation portion R1 can coincide with the surface location of the guard ring structure in the outer peripheral breakdown proof portion R2. It becomes possible to facilitate surface planarization of the semiconductor substrate 6 etc.

Second Embodiment

A second embodiment will be described. The present embodiment can be a modification of the first embodiment in configuration of the JFET separation portion R3. As for other points, the present embodiment can be the same as the first embodiment, and hence, only parts different from the first embodiment may be explained.

Figure 24:
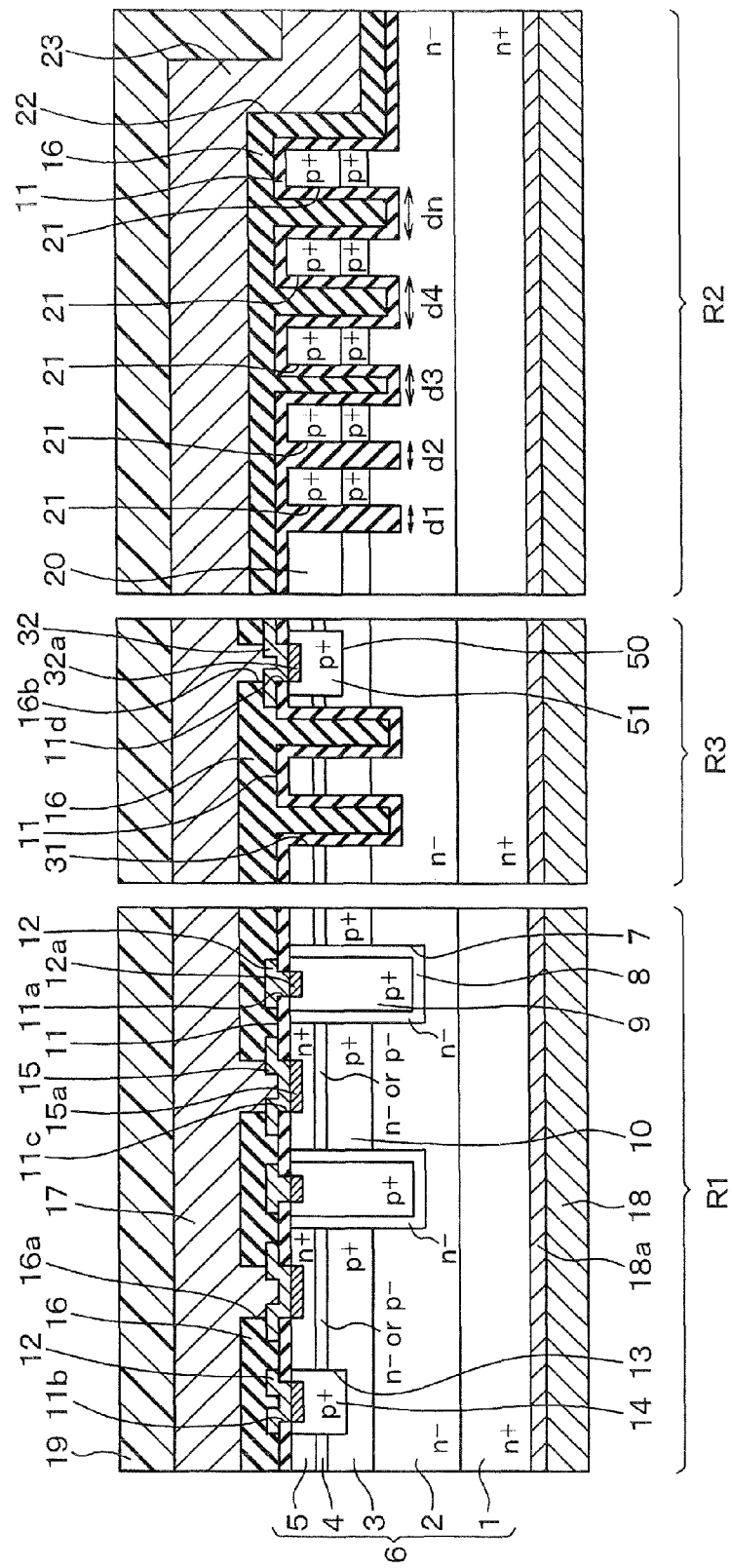
FIG. 24 is a sectional view illustrating an SiC semiconductor device with a JFET of a second embodiment.

FIG. 24 is a sectional view of a SiC semiconductor device with a JFET of the present embodiment. As shown in FIG. 24, the $n^+$-type source layer 5 and the buffer layer 4 also remain in the JFET separation portion R3. A trench 50 is formed at a part of the semiconductor substrate 6 contacting the extraction electrode 32. A $p^+$-type contact layer 51 is formed in the trench 50. The $p^+$-type contact layer 51 formed in the trench 50 is located deeper than the $n^+$-type source layer 5 and the buffer layer 4. The $p^+$-type contact layer 51 has such a depth that the $p^+$-type contact layer 51 contacts the $p^+$-type SiC layer 3. Because of this structure, at a time of the breakdown, a breakdown current can be transferred from the $p^+$-type SiC layer 3 and the $p^+$-type contact layer 51 to the source wire 17 via the extraction electrode 32.

In this way, the JFET separation portion R3 is also configured such that the $n^+$-type source layer 5 and the buffer layer 4 remain in the JFET separation portion R3. A path for transferring the breakdown current can be formed by the $p^+$-type contact layer 51.

Figure 25:
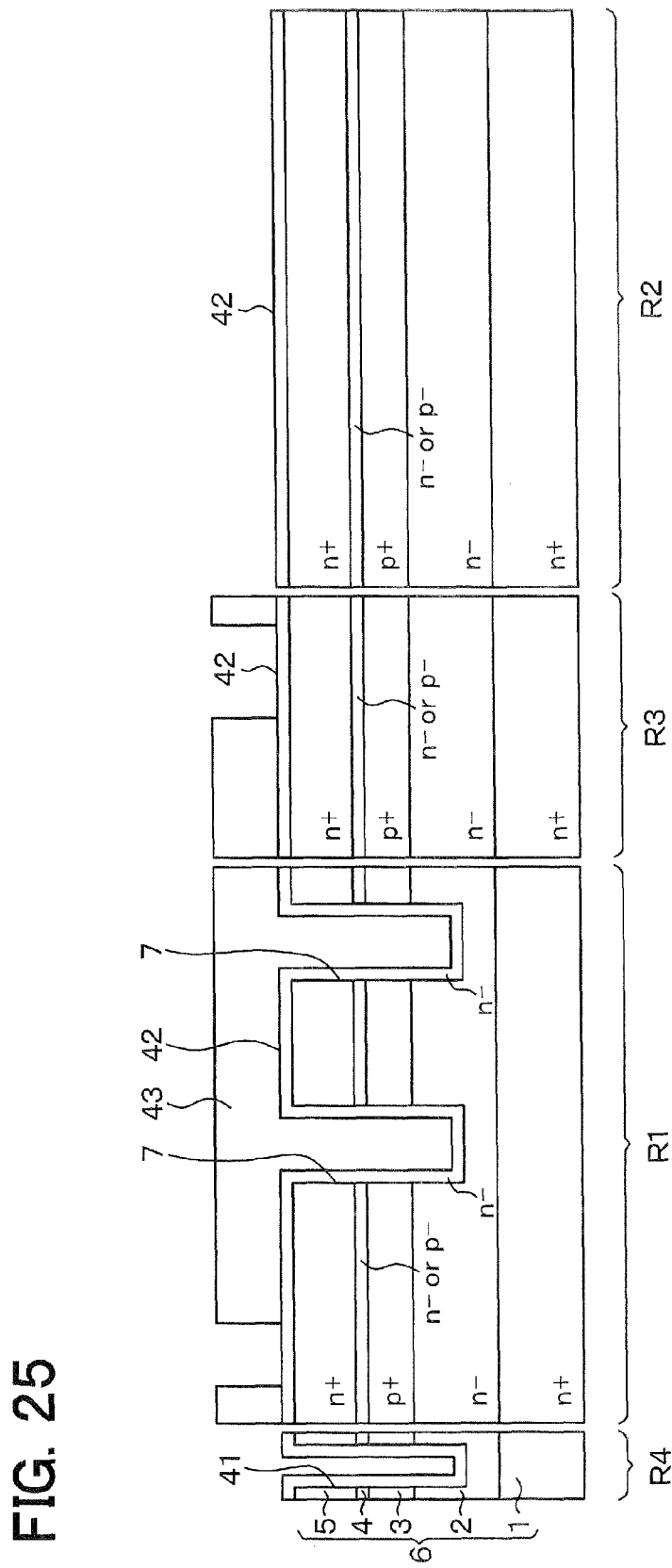
FIG. 25 is a sectional view illustrating a manufacturing process of the SiC semiconductor device illustrated in FIG. 24.

A manufacturing method of the above-structured SiC semiconductor device with the JFET can be substantially the same as that of the first embodiment. It may be sufficient to replace the process in FIG. 6 of the first embodiment with a process illustrated in FIG. 25. Specifically, as shown in FIG. 25, when the mask film 43 are patterned, openings are formed at an area of the outer peripheral breakdown proof portion R2 of the semiconductor substrate 6, an area where the trench 13 is to be formed, and an area where the trench 50 is to be formed. Then, when the trench 13 and the outer peripheral breakdown proof portion are etched with the use of this mask film 43, the trench 50 is formed. Then, the manufacturing processes illustrated in drawings subsequent to FIG. 7 are performed. In this way, it is possible to manufacture the SiC semiconductor device with the JFET of the present embodiment.

Third Embodiment

A third embodiment will be described.

A semiconductor device of the present embodiment includes a Schottky diode in place of the guard ring structure of the first embodiment in the outer peripheral breakdown proof portion R2. As for other points, the present embodiment can be substantially the same as the first embodiment; hence, only parts different from the first embodiment will be described.

Figure 26:
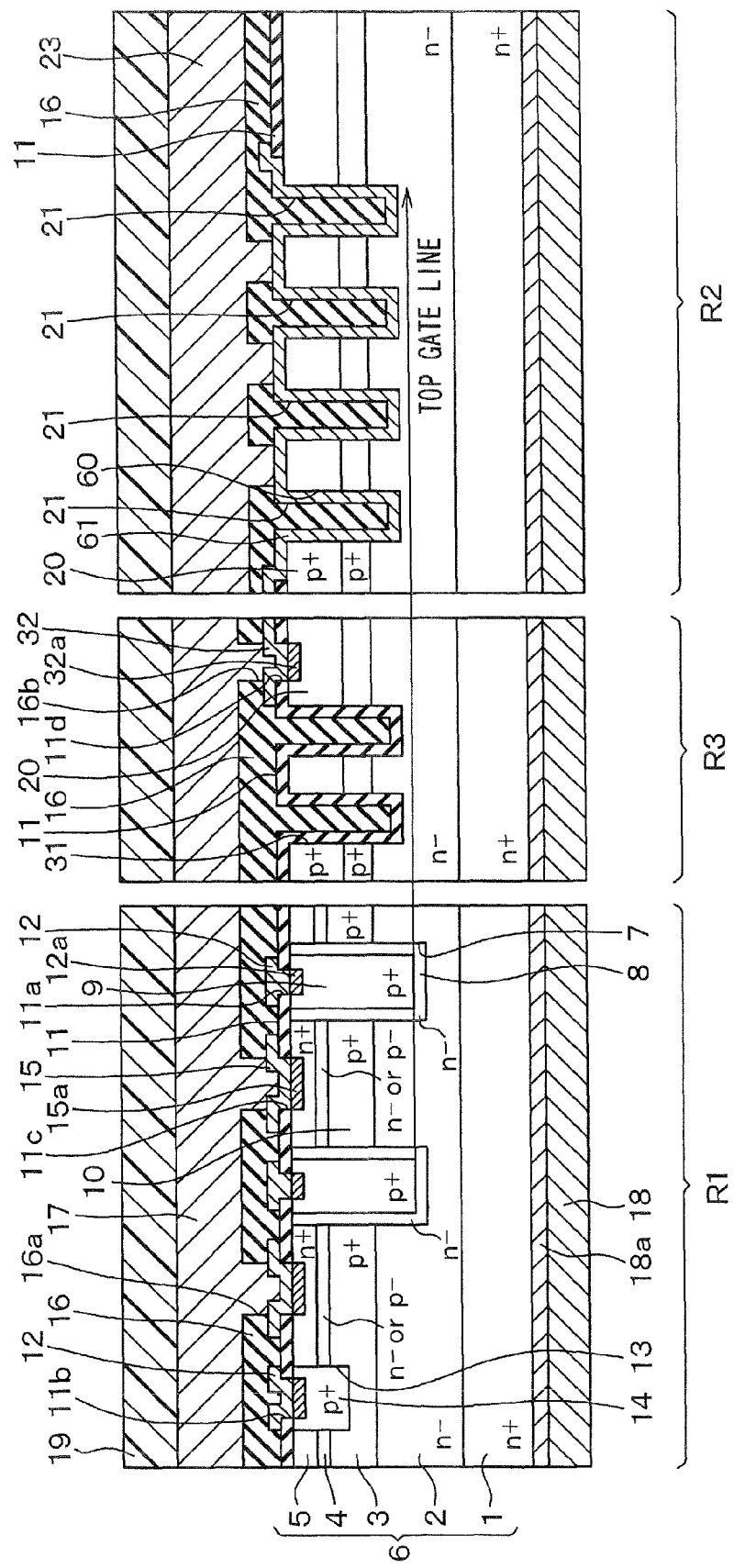
FIG. 26 is a sectional view illustrating an SiC semiconductor device with a JFET of a third embodiment.

FIG. 26 is sectional view of an SiC semiconductor device with a JFET of the present embodiment. As shown in FIG. 26, in the outer peripheral breakdown proof portion R2, multiple trenches 60 are formed at regular intervals. The trenches 60 penetrate through the p$^+$-type SiC layer 3 and the p$^+$-type layer 20 into the n$^-$-type drift layer 2, and have a frame shape surrounding the JFET formation portion R1 Depth of each trench 60 is smaller than depth of the top gate layer 9. A Schottky electrode 61 is arranged in this trench 60. The Schottky electrode 61 is made of a Schottky material such as Ti etc., and the Schottky electrode 61 contacting the n$^-$-type drift layer 2 has a Schottky contact. As seen from the above, the Schottky diode is constructed from the Schottky electrode 61, the n$^-$-type drift layer 2 and the n$^+$-type SiC base 1.

In this way, the SiC semiconductor device can include the Schottky diode. Manufacturing processes of the SiC semiconductor device of the present embodiment can be generally the same as those of the first embodiment. For example, prior to the process illustrated in FIG. 18, the interlayer insulation film 11 is patterned and the interlayer insulation film 11 in the outer peripheral breakdown proof portion R2 is removed. In forming the gate wire 12 and the extraction electrode 32 with the Ti film etc. as shown in FIG. 18, the Schottky electrode 61 may be also formed.

It should be noted that although the Schottky diode is used in place of the guard ring structure in the above-described example, both of the guard ring structure and the Schottky diode can be arranged. In this case, the guard ring structure may be arranged so as to surround the Schottky diode. In addition, although the multiple trenches 60 are arranged at regular intervals, the multiple trenches 60 may not be arranged at regular intervals. Furthermore, one trench 60 may be arranged in place of multiple trenches 60.

Other Embodiments

In the above embodiments, an n-channel type JFET is illustrated as an example. However, the embodiments are applicable to a p-channel type JFET, which can be obtained by inversion between n-type and p-type in the above embodiments.

Moreover, in the above embodiments, the top gate layer 9 and the embedded gate layer 10 are connected to the same gate wire 12. Alternatively, the top gate layer 9 and the embedded gate layer 10 may be connected to different first and second gate wires, so that different electric potentials are applicable to the top gate layer 9 and the embedded gate layer 10, respectively.

Moreover, in the above embodiments, the n$^+$-type source layer 5 is arranged above the p$^+$-type SiC layer 3 through the buffer layer 4. However, since toe buffer layer 4 can be arranged on an as-needed basis, the n$^+$-type source layer 5 may be formed directly on the p$^+$-type SiC layer 3.

Moreover, in the above embodiments, the SiC semiconductor is illustrated as an example of semiconductor device. However, the embodiments are applicable to an Si semiconductor device, and other wideband-gap semiconductor devices. For example, the embodiments are applicable to a semiconductor device made of GaN, diamond, AlN etc.

According to an example of embodiments, a semiconductor device with a junction field-effect transistor can be configured as follows. The junction field-effect transistor includes a base, a drift layer, a semiconductor layer, a source layer, a first trench, a channel layer, a top gate layer, a first gate wire, a second gate wire, and a drain electrode. The base has a principal surface, is made of a semiconductor material, and has a first conductivity type. The drift layer is arranged above the base, is configured as an epitaxial layer, and has the first conductivity type. The semiconductor layer is arranged above the drift layer and has a second conductivity type. The source layer is arranged above the semiconductor layer, has the first conductivity type, and has an impurity concentration larger than the drift layer. The first trench penetrates through the source layer and the semiconductor layer into the drift layer. The channel layer is arranged in the first trench, and has the first conductivity type. The top gate layer is arranged on a surface of the channel layer in the first trench, and has the second conductivity type. The first gate wire is electrically connected to the top gate layer. The second gate wire is electrically connected to an embedded gate layer, which is a part of the semiconductor layer adjoining the channel layer. The source electrode is electrically connected to the source layer. The drain electrode is electrically connected to a rear surface of the substrate. The semiconductor device further includes a second trench and a contact embedded layer. The second trench penetrates through the source layer into the embedded gate layer. The contact embedded layer completely fills the second trench, and has the second conductivity type. The second gate wire is connected to the contact embedded layer, so that the second gate wire is connected to the embedded gate layer via the contact embedded layer.

According to the above semiconductor device, an electrical connection between the embedded gate layer and the second gate wire is made by the contact embedded layer arranged in the second trench. Therefore, width of the second trench, in which only the contact embedded layer is arranged, can be narrowed down, as compared with width of a trench of a conventional semiconductor device where an interlayer insulation film and a gate wire etc. are arranged in the trench. Therefore, the semiconductor device with the JFET can downsize a contact structure between the embedded gate layer and the second gate wire.

The above semiconductor device may be configured as follows. A bottom surface and a side surface of the second trench are Si-face and a-face, respectively. The impurity concentration of a part of the contact embedded layer arranged on the bottom surface of the second trench is larger than that of another part of the contact embedded layer arranged on the side surface of the second trench.

In the above configuration, while providing a high breakdown resistance of a PN junction between the contact embedded layer and the source layer, it is possible to reduce a sheet resistance at a contact portion between the contact embedded layer and the embedded gate layer.

Alternatively, the contact embedded layer may be configured to have such a concentration distribution that an impurity concentration increases with increasing distance away from a contact portion with the source layer. In this configuration also, it is possible to provide a high breakdown resistance of a PN junction between the contact embedded layer and the source layer. Formation of this structure may be difficult if the contact embedded layer is formed by ion implantation because the conductivity type of the source layer needs to be inversed; however, the formation of this structure may be easily carried out if the contact embedded layer is epitaxially grown.

The above semiconductor device may be configured as follows. The semiconductor device with the junction field effect transistor further includes: a cell portion in which the junction field-effect transistor is formed; and an outer peripheral breakdown proof portion that surrounds the cell portion.

In the outer peripheral breakdown proof portion, the source layer is removed, and removal of the source layer exposes a surface of the semiconductor layer, and a second conductivity type layer is arranged on the exposed surface of the semiconductor layer. The outer peripheral breakdown proof portion includes a guard ring structure that has a frame shape surrounding the cell portion. The guard ring structure includes: multiple third trenches that penetrate through the second conductivity type layer and the semiconductor layer, and are arranged is at regular intervals; and an insulation film that is arranged in the third trenches.

As seen the above, in the outer periphery breakdown resistance portion, after the source layer is removed, the second conductivity type layer is arranged on the exposed surface of the semiconductor layer. According to the above, if the semiconductor layer becomes too thin in removing the source layer, the arrangement of the second conductivity type layer can ensure enough thickness of a second conductivity type region for constituting the guard ring structure.

In this case, the above semiconductor device may be configured such that a surface of the second conductivity type layer in the outer peripheral breakdown proof portion, and respective surfaces of the source layer, the channel layer and the top gate layer in the cell portion are on a same plane. In this configuration, it is possible to easily perform the planarization of the surfaces of the source layer, the channel layer and the top gate layer in the cell portion.

The above semiconductor device may be configured as follows. The semiconductor device further includes: a cell portion in which the junction field-effect transistor is formed; an outer peripheral breakdown proof portion that surrounds the cell portion; and an element separation portion that is arranged at a boundary location between the cell portion and the outer peripheral breakdown proof portion. In the outer peripheral breakdown proof portion, the source layer is removed, and removal of the source layer exposes a surface of the semiconductor layer, and a second conductivity type layer is arranged on the exposed surface of the semiconductor layer. In the element separation portion, an extraction electrode is electrically connected to the semiconductor layer via the second conductivity type layer.

In this way, the source layer in the element separation portion can be removed, and a path for transferring a breakdown current can be formed by the second conductivity type layer.

The above semiconductor device may be configured as follows. The semiconductor device further includes: a cell portion in which the junction field-effect transistor is formed; an outer peripheral breakdown proof portion that surrounds the cell portion; and an element separation portion that is arranged at a boundary location between the cell portion and the outer peripheral breakdown proof portion. The element separation portion includes: an extraction electrode that is electrically connected to the semiconductor layer located in the element separation portion; a fourth trench that penetrates through the source layer located in the element separation portion, and penetrates into the semiconductor layer located in the element separation portion; and a contact layer embedded in the fourth trench. The extraction electrode is electrically connected to the semiconductor layer via the contact layer.

In this way, the source layer can remain in the element separation portion, and a path for transferring a breakdown current can be formed by the contact layer.

The above semiconductor device may be configured as follows. The semiconductor device further includes: a cell portion in which the junction field-effect transistor is formed; an outer peripheral breakdown proof portion that surrounds the cell portion; a Schottky diode. In the outer peripheral breakdown proof portion, the source layer is removed, and removal of the source layer exposes a surface of the semiconductor layer, and a second conductivity type layer is arranged on the exposed surface of the semiconductor layer. The Schottky diode that includes: a fifth trench that has a frame shape surrounding the cell portion, and penetrates through the second conductivity type layer and the semiconductor layer into the drift layer; and a Schottky electrode that is arranged in the fifth trench and is electrically connected to the drift layer.

According to a second example of embodiments, a manufacturing method of the semiconductor device can be provided. For example, the manufacturing method includes preparing a semiconductor substrate. The semiconductor substrate includes: a base that has a principal surface, is made of a semiconductor material, and has a first conductivity type; a drift layer that is formed above the base by epitaxial growth, and has the first conductivity type; a semiconductor layer that is formed above the drift layer and has a second conductivity type; and a source layer that is formed above the semiconductor layer, has an impurity concentration larger than the drift layer, and has the first conductivity type. The manufacturing method further includes: forming a first trench that penetrates through the source layer and the semiconductor layer into the drift layer; forming a channel layer having the first conductivity type on a surface of the semiconductor substrate including an inside of the first trench; forming a second trench spaced apart from the first trench, so that the second trench penetrates through the channel layer and the source layer into the semiconductor layer; forming a second conductivity type layer in the first trench and in the second trench, so that in the first trench, the second conductivity type layer is formed on a surface of the channel layer; and removing the second conductivity type layer and the channel layer above the source layer by planarization of a surface of the semiconductor substrate after forming the second conductivity type layer, so that a top gate layer is formed in the first trench and a contact embedded layer is formed in the second trench. In the above, the top gate layer is formed from the channel layer and the second conductivity type layer in the first trench, and the contact embedded layer is formed from the second conductivity type layer in the second trench. The manufacturing method further includes: forming an interlayer insulation film on a surface of the semiconductor substrate and forming contact holes for exposing the source layer, the top gate layer and the contact embedded layer in the interlayer insulation film, respectively; forming a source electrode electrically connected to the source layer through a first one of the contact holes, a first gate wire electrically connected to the top gate layer through a second one of the contact holes, and a second gate wire electrically connected to the contact embedded layer through a third one of the contact holes; and forming a drain electrode electrically connected to the base on a rear surface of the semiconductor substrate.

According to the above manufacturing method, it is possible to manufacture a semiconductor device with a JFET that can downsize a contact structure between an embedded gate layer and a gate wire.

In the above manufacturing method of the semiconductor device, an outer peripheral breakdown proof portion may be formed so as to surround a cell portion in which the junction field-effect transistor is to be formed. In forming the second trench, the source layer in the outer peripheral breakdown proof portion may be removed to expose a surface of the semiconductor layer. In forming the second conductivity type layer, the second conductivity type layer may be formed further on the exposed surface, which is exposed by removing the source layer, of the semiconductor layer. In the planarization of the surface of the semiconductor substrate, the planarization may be performed to a surface of the second conductivity type layer formed in the outer peripheral breakdown proof portion.

As described above, when the planarization of the surface of the semiconductor substrate is performed to the surface of the second conductivity type layer formed in the outer peripheral breakdown proof portion, it becomes possible to easily perform the planarization of the surface of the semiconductor substrate.

In the manufacturing method of the semiconductor device, an element separation portion may be formed at a boundary location between the cell portion and the outer peripheral breakdown proof portion. In forming the second trench, the source layer in the element separation portion may be removed to expose a surface of the semiconductor layer. In forming the second conductivity type layer, the second conductivity type layer may be formed further on the exposed surface, which is exposed by removing the source layer, of the semiconductor layer. In forming the interlayer insulation film and forming the contact holes, another contact hole for exposing the second conductivity type layer in the element separation portion may be formed in the interlayer insulation film. In forming the source electrode and the second gate wire, an extraction electrode may be further formed. The extraction electrode is electrically connected to the second conductivity type layer through the another contract hole formed in the interlayer insulation film in the element separation portion. By using this manufacturing method, it is possible to manufacture the semiconductor device in which the source layer in the element separation portion can be removed, and a path for transferring a breakdown current can be formed by the extraction electrode.

In the manufacturing method of the semiconductor device, an element separation portion may be formed at a boundary location between the cell portion and the outer peripheral breakdown proof portion. In forming the second trench, a third trench penetrating through the source layer into the semiconductor layer may be formed in the element separation region. In forming the second conductivity type layer, the second conductivity type layer may be formed further in the third trench in the element separation portion. In the planarization of the surface of the semiconductor substrate, the planarization may be performed, so that the second conductivity type layer remains only in the third trench thereby to form a contact layer. In forming the interlayer insulation film and forming the contact holes, another contact hole for exposing the contact layer in the element separation portion may be formed in the interlayer insulation film. In forming the source electrode and the second gate wire, an extraction electrode may be further formed. The extraction electrode is electrically connected to the contact layer through the another contract hole formed in the interlayer insulation film in the element separation portion is formed. By using this manufacturing method, it is possible to manufacture the semiconductor device in which the source layer can remain in the element separation portion, and a path for transferring a breakdown current can be formed by the contact layer.

While the invention has been described above with reference to various embodiments thereof, it is to be understood that the invention is not limited to the above described embodiments and constructions. The invention is intended to cover various modifications and equivalent arrangements.

What is claimed is:

1. A semiconductor device with a junction field-effect transistor, the semiconductor device comprising:
   a junction field-effect transistor including:
      a base that has a principal surface, is made of a semiconductor material, and has a first conductivity type;
      a drift layer that is arranged above the base, is configured as an epitaxial layer, and has the first conductivity type;
      a semiconductor layer that is arranged above the drift layer and has a second conductivity type;
      a source layer that is arranged above the semiconductor layer, has the first conductivity type, and has an impurity concentration larger than the drift layer;
      a first trench that penetrates through the source layer and the semiconductor layer into the drift layer;
      a channel layer that is arranged in the first trench and has the first conductivity type;
      a top gate layer that is arranged on a surface of the channel layer in the first trench, and has the second conductivity type;
      a first gate wire that is electrically connected to the top gate layer;
      a second gate wire that is electrically connected to an embedded gate layer, wherein the embedded gate layer is a part of the semiconductor layer adjoining the channel layer;
      a source electrode that is electrically connected to the source layer; and
      a drain electrode that is electrically connected to a rear surface of the substrate,
   a second trench that penetrates through the source layer into the embedded gate layer; and
   a contact embedded layer that completely fills the second trench, and has the second conductivity type,
   wherein:
   the second gate wire is connected to the contact embedded layer, so that the second gate wire is connected to the embedded gate layer via the contact embedded layer.

2. The semiconductor device with the junction field-effect transistor according to claim 1, wherein:
   a bottom surface and a side surface of the second trench are Si-face and a-face, respectively; and
   the impurity concentration of a part of the contact embedded layer arranged on the bottom surface of the second trench is larger than that of another part of the contact embedded layer arranged on the side surface of the second trench.

3. The semiconductor device with the junction field-effect transistor according to claim 1, further comprising:
   a cell portion in which the junction field-effect transistor is formed
   an outer peripheral breakdown proof portion that surrounds the cell portion,
   wherein:
   in the outer peripheral breakdown proof portion, the source layer is removed, and removal of the source layer exposes a surface of the semiconductor layer, and a second conductivity type layer is arranged on the exposed surface of the semiconductor layer; and
   the outer peripheral breakdown proof portion includes a guard ring structure that has a frame shape surrounding the cell portion, the guard ring structure including:
      a plurality of third trenches that penetrates through the second conductivity type layer and the semiconductor layer, and is arranged is at regular intervals; and
      an insulation film that is arranged in the third trenches.

4. The semiconductor device with the junction field-effect transistor according to claim 3, wherein:
- a surface of the second conductivity type layer in the outer peripheral breakdown proof portion, and respective surfaces of the source layer, the channel layer and the top gate layer in the cell portion are on a same plane.

5. The semiconductor device with the junction field-effect transistor according to claim 1, further comprising:
- a cell portion in which the junction field-effect transistor is formed;
- an outer peripheral breakdown proof portion that surrounds the cell portion; and
- an element separation portion that is arranged at a boundary location between the cell portion and the outer peripheral breakdown proof portion, wherein:
- in the outer peripheral breakdown proof portion, the source layer is removed, and removal of the source layer exposes a surface of the semiconductor layer, and a second conductivity type layer is arranged on the exposed surface of the semiconductor layer; and
- in the element separation portion, an extraction electrode is electrically connected to the semiconductor layer via the second conductivity type layer.

6. The semiconductor device with the junction field-effect transistor according to claim 1, further comprising:
- a cell portion in which the junction field-effect transistor is formed;
- an outer peripheral breakdown proof portion that surrounds the cell portion; and
- an element separation portion that is arranged at a boundary location between the cell portion and the outer peripheral breakdown proof portion, the element separation portion including:
  - an extraction electrode that is electrically connected to the semiconductor layer located in the element separation portion;
  - a fourth trench that penetrates through the source layer located in the element separation portion, and penetrates into the semiconductor layer located in the element separation portion; and
  - a contact layer embedded in the fourth trench,
- wherein the extraction electrode is electrically connected to the semiconductor layer via the contact layer.

7. The semiconductor device with the junction field-effect transistor according to claim 1, further comprising:
- a cell portion in which the junction field-effect transistor is formed;
- an outer peripheral breakdown proof portion that surrounds the cell portion, wherein in the outer peripheral breakdown proof portion, the source layer is removed, and removal of the source layer exposes a surface of the semiconductor layer, and a second conductivity type layer is arranged on the exposed surface of the semiconductor layer; and
- a Schottky diode that includes
  - a fifth trench that has a frame shape surrounding the cell portion, and penetrates through the second conductivity type layer and the semiconductor layer into the drift layer, and
  - a Schottky electrode that is arranged in the fifth trench and is electrically connected to the drift layer.

* * * * *